US010386212B2

(12) United States Patent
Mann et al.

(10) Patent No.: US 10,386,212 B2
(45) Date of Patent: Aug. 20, 2019

(54) FLOW-INDUCED NOISE SOURCE CONTRIBUTION

(71) Applicant: Dassault Systemes Simulia Corp., Johnston, RI (US)

(72) Inventors: Adrien Mann, Palo Alto, CA (US); Franck Léon Pérot, Arlington, MA (US)

(73) Assignee: Dassault Systemes Simulia Corp., Johnston, RI (US)

( * ) Notice: Subject to any disclaimer, the term of this patent is extended or adjusted under 35 U.S.C. 154(b) by 36 days.

(21) Appl. No.: 15/189,609

(22) Filed: Jun. 22, 2016

(65) Prior Publication Data

US 2017/0370751 A1 Dec. 28, 2017

(51) Int. Cl.
*G01F 1/32* (2006.01)
*G06F 17/50* (2006.01)
*G10K 11/16* (2006.01)

(52) U.S. Cl.
CPC ........ *G01F 1/3209* (2013.01); *G06F 17/5018* (2013.01); *G10K 11/16* (2013.01); *G06F 17/5095* (2013.01); *Y02T 90/50* (2018.05)

(58) Field of Classification Search
CPC .............. G01F 1/3209; G06F 17/5018; G06F 17/5009; H04R 3/00; A61F 11/06; H04B 15/00
See application file for complete search history.

(56) References Cited

U.S. PATENT DOCUMENTS

| 4,480,333 | A | * | 10/1984 | Ross | G10K 11/1784 381/71.12 |
| 6,201,872 | B1 | * | 3/2001 | Hersh | G10K 11/178 381/71.5 |
| 9,037,440 | B2 | * | 5/2015 | Sun | G06F 17/5018 703/2 |
| 2011/0075857 | A1 | * | 3/2011 | Aoyagi | G01S 3/8036 381/92 |
| 2014/0257772 | A1 | * | 9/2014 | Perot | G06F 17/5009 703/2 |

OTHER PUBLICATIONS

International Search Report and Written Opinion; PCT/US2013/038143; dated Sep. 1, 2017; 12 pages.

(Continued)

*Primary Examiner* — Harshad R Patel
*Assistant Examiner* — Nigel H Plumb
(74) *Attorney, Agent, or Firm* — Fish & Richardson P.C.

(57) ABSTRACT

A system and method for simulating activity of a fluid in a volume that represents a physical space, the activity of the fluid in the volume being simulated so as to model movement of elements within the volume. The method includes at a first time, identifying a first set of vortices in a transient and turbulent flow. The method includes at a second time that is subsequent to the first time, identifying a second set of vortices. The method includes tracking changes in the vortices by comparing the first set and the second set of discrete vortices. The method includes identifying one or more noise sources based on the tracking. The method includes determining the contribution of one or more noise sources at a receiver. The method also includes outputting data indicating one or more modifications to one or more geometric features of a device or an entity.

39 Claims, 35 Drawing Sheets

(56) References Cited

OTHER PUBLICATIONS

PCT International Preliminary Report on Patentability in International Application No. PCT/US2017/038143, dated Dec. 25, 2018.
EP Extended European Search Report in European Appln. No. 17816005.7, dated Jun. 3, 2019, 9 pages.
Mann et al, "Designing quieter HVAC systems coupling LBM and flow-induced noise source identification methods", 10TH FKFS-Conference. Progress in Vehicle Aerodynamics and Thermal Management, 2015, pp. 1-14.

\* cited by examiner

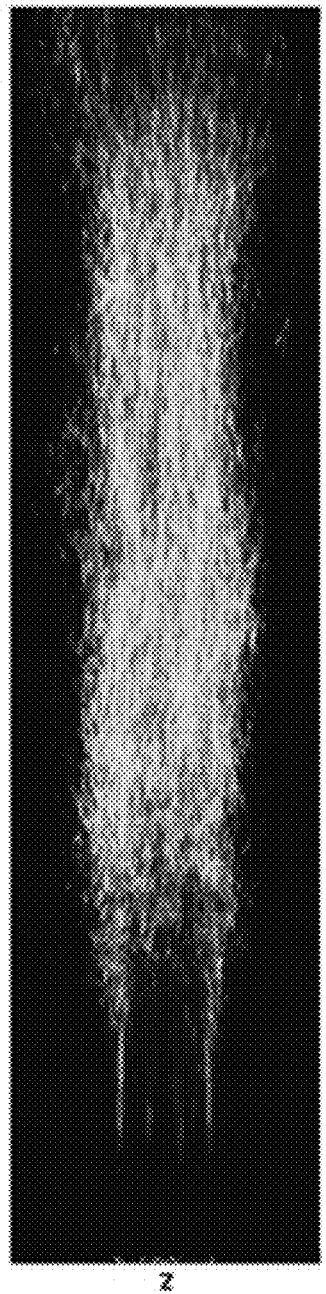
FIG. 22A
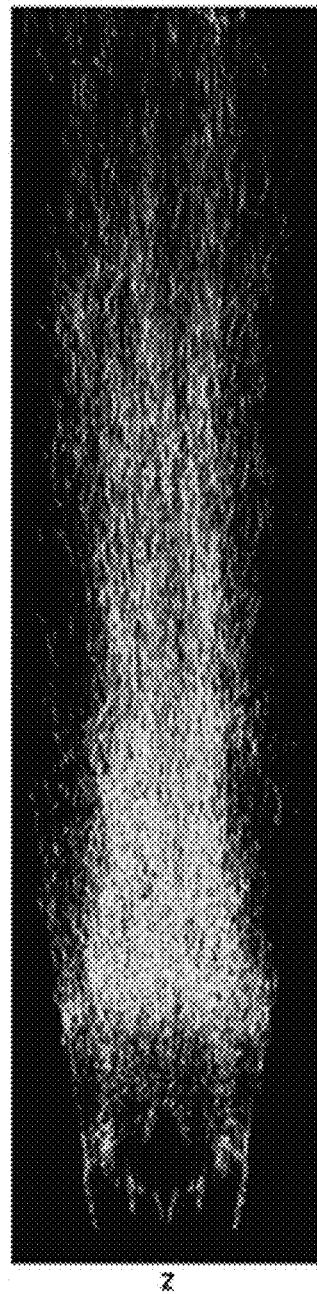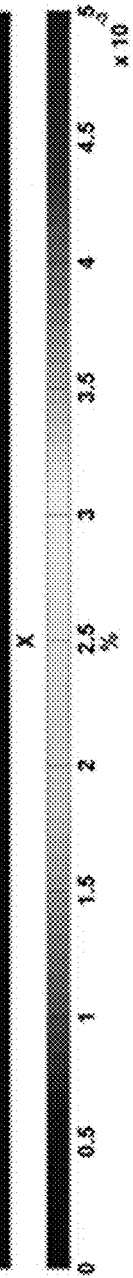
FIG. 22B

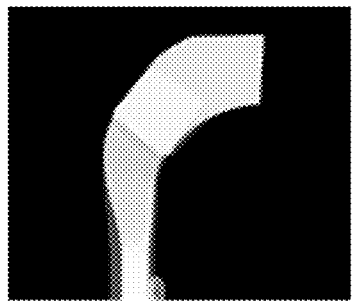
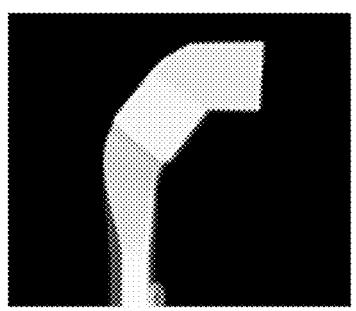
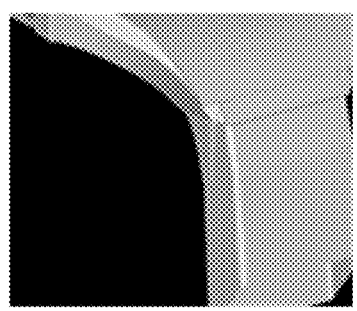
FIG. 38B
FIG. 39B
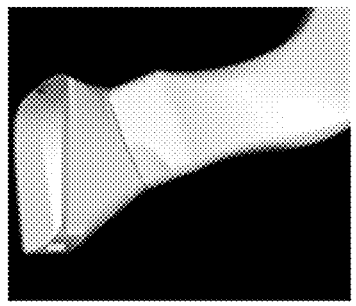
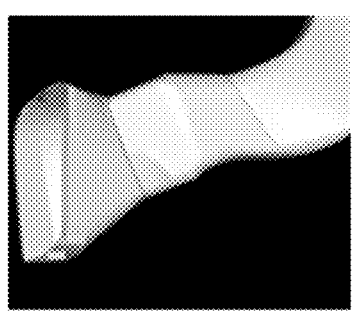
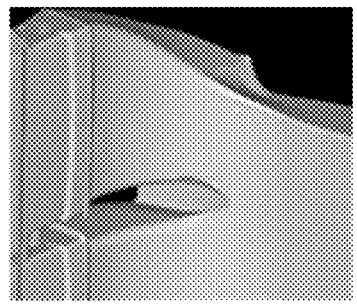
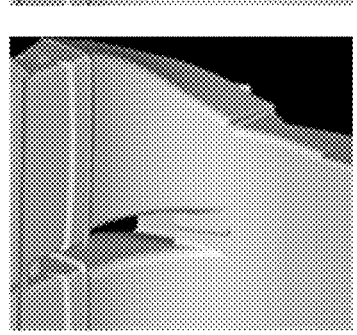
FIG. 38A
FIG. 39A Clustering of the noise sources for high fan speed Generic vehicle cabin with acoustic sources/power in the HVAC duct shown in the left and clustered acoustic sources shown in the right

FLOW-INDUCED NOISE SOURCE CONTRIBUTION

TECHNICAL FIELD

A system and method for automatically detecting and tracking time and space variations of flow structures in order to locate and characterize the flow structures which produce noise and to quantify the corresponding acoustic radiation properties is described herein. The system improves the computational efficiency of the computer executing the simulation process by reducing the required memory required to identify noise sources, reducing the processing operations required to identify the sources, as described herein.

BACKGROUND

In our society, acoustic comfort is taking a growing importance and a significant engineering time is spent on finding and developing noise reduction solutions. A major source of annoyance is related to flow-induced noise mechanisms such as jets, airframe, trains, rotating geometries and duct systems noise. Often expertise, intuition, and trial-and-error approach is used to identify which parts of a system should be worked on and optimized to reduce noise generation. In some additional examples, some experimental methods such as beam-forming, acoustic holography and two points correlation methods are productively used but require physical prototyping and wind-tunnel testing which are both time consuming and expensive. As another example, Computational AeroAcoustics (CAA) simulations provide flow field information to provide valuable insight on the flow topology.

SUMMARY

A method and system for tracking vortices and systems of vortices likely to radiate noise to the far-field is described herein. The methods described herein can also be used to capture transient and statistical properties of turbulent flow coherent structures.

In general, one aspect of the subject matter described in this specification can be embodied in methods that include the actions of simulating activity of a fluid in a volume, the activity of the fluid in the volume being simulated so as to model movement of elements within the volume. The method also includes, at a first time in the fluid flow simulation, identifying a first set of vortices in a transient and turbulent flow modeled by the fluid flow. The method also includes, at a second time in the fluid flow simulation that is subsequent to the first time, identifying a second set of vortices in the transient and turbulent flow. The method includes, tracking changes in the vortices by comparing the first set of discrete vortices and the second set of discrete vortices, and identifying one or more potential sound generating vortex structures based on the tracking. The methods include identifying one or more noise sources based on the tracking. The methods include determining the contribution of one or more noise sources at a receiver. The method includes outputting data indicating one or more modifications to one or more geometric features of a device or an entity, based on the contribution of the one or more noise sources at the receiver Other embodiments of this aspect include corresponding computer systems, apparatus, and computer programs recorded on one or more computer storage devices, each configured to perform the actions of the methods. A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

In general, one aspect of the subject matter described in this specification can be embodied in methods that include the actions of simulating activity of a fluid in a volume to generate flow data, the activity of the fluid in the volume being simulated so as to model movement of elements within the volume. The method also includes identifying one or more potential sound generating vortex structures based on changes in vortices between a first time in the fluid flow simulation and a second time in the fluid flow simulation and identifying one or more regions on a surface that generate the sound generating vortex structures based at least in part on the identified one or more potential sound generating vortex structures and the generated flow data.

The foregoing and other embodiments can each optionally include one or more of the following features, alone or in combination.

Determining the contribution of one or more noise sources at a receiver may include applying a transfer function to at least one noise source, wherein the transfer function determines the contribution based on a relationship between a location of the noise source and a location of the receiver. The transfer functions may be frequency dependent. The methods may include the actions of combining a plurality of the one or more noise sources into one or more clusters, wherein the one or more noise sources are clustered based, at least in part, on the contribution of the one or more noise sources. The methods may include the actions of comparing a strength of each of the one or more noise source contributions to a threshold value and excluding at least one noise source that has a strength beneath the threshold. The receiver may be located at a position corresponding to an audio recording device or a human ear. The methods may include the actions of applying a transfer function to the one or more sound generating flow regions subsequent to the combining. The methods may include the actions of comparing a strength of each of the one or more noise source to a threshold value and excluding at least one noise source that has a strength beneath the threshold. The methods may include the action of determining a second set of one or more noise sources based on a second simulation that corresponds to different physical conditions in or around the device or entity. Combining the plurality of the one or more noise sources into the one or more clusters may improve the processing performance of the system. Causing a physical modification to one or more physical objects based on the identified area for design change. The methods may include the actions of building a physical object based using the physical modifications. The method may include the actions of optimizing a design change to minimize the contribution of one or more noise sources.

Identifying the one or more potential sound generating vortex structures can include at the first time in the fluid flow simulation, identifying a first set of vortices in a transient and turbulent flow modeled by the fluid flow, at the second time in the fluid flow simulation that is subsequent to the first time, identifying a second set of vortices in the transient and turbulent flow, tracking changes in the vortices by comparing the first set of discrete vortices and the second set of discrete vortices, and identifying the one or more potential sound generating vortex structures based on the tracking.

BRIEF DESCRIPTION OF THE FIGURES

FIGS. 22A and 22B show simulated spatial distributions of vortices for the nozzle designs of FIGS. 21A and 21B.

FIGS. 38A and 38B show modifications of the ducts geometry.

FIGS. 39A and 39B show modifications of the ducts geometry.

DESCRIPTION

A Flow-Induced Noise Identification Method (FINSIM) is described herein. Coherent vortex structures in flows are closely related to the flow-induced noise generation mechanisms and it is assumed that by characterizing the time and spatial evolutions of relevant vortices, the physical sources that are responsible for generating the noise can be identified. More particularly, a method and system for identifying and tracking vortices and systems of vortices likely to radiate noise to the far-field is described herein. In case of thermal configurations, FINSIM can also be used to analyze space and time variations of the temperature field (or any relevant passive or active scalar field) to estimate the acoustics radiation of entropy sources.

The systems and methods described herein identify noise produced by the vortex motions (e.g., Co-Rotating Vortex systems—CRV) and vortex stretching. For example, the system identifies:

1. Each relevant vortex pair as discrete CRV systems and determines the equivalent quadrupole-like sources and corresponding acoustic radiation (e.g., the transient flow field is used to track the CRV motion and reconstruct the radiated field according to Powell's theory);

2. Stretching rate of each vortex detected in the flow and corresponding dipole-like acoustic radiation; and/or 3. Entropy sources and corresponding monopole-like acoustic radiation.

By analyzing the motion of the entire flow field of vortices, the complete far-field noise can be estimated and properties of the physical noise sources can be analyzed.

The contribution of each noise-generating vortices to a receiver can be determined by using a transfer function. But another way, each noise vortices can be analyzed to determine how much of the noise generated by the noise-generating vortices is heard by a receiver (for example, an ear of a human operator and/or passenger of a device while the operator and/or passenger of the device utilizes the device in an intended manner (e.g. driving or riding in a car)).

Noise vortices may be clustered into groups. The clusters may help to identify a source of the noise, or an area of a design to modify in order to reduce the noise. At the same time, the system may adjust the noise vortices or clusters based on the level of the noise that can be heard by an individual placed within the design space.

Overview

Figure 1A:
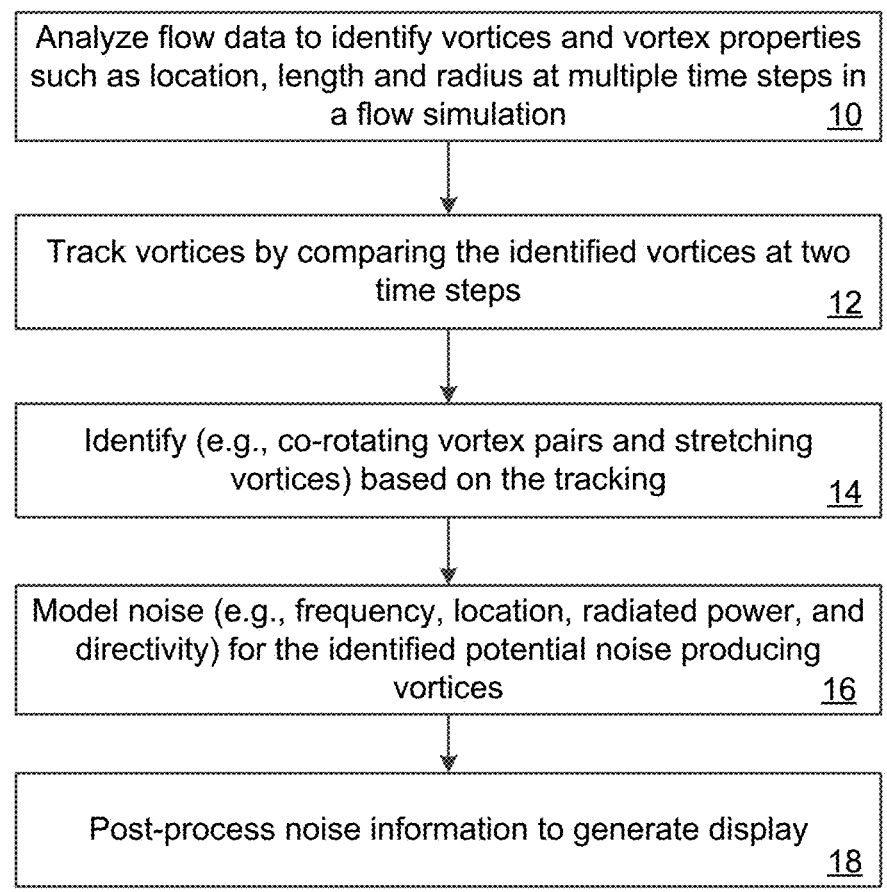
FIG. 1A shows a flow chart of a process for flow-induced noise identification.

FIG. 1A shows a flow chart of a process for flow-induced noise identification. The system receives transient flow data from a fluid flow simulation from computational fluid dynamics solvers based, for instance on Navier-Stokes and Lattice Boltzmann. Such simulation data provides the time and space dependent volumetric information used to identify vortices.

The method includes analyzing flow data to identify the vortices and vortex properties such as location length and radius and circulation at multiple time steps in the flow simulation (10). As described in more detail below, for each time frame, the system identifies multiple vortices with each vortex being represented by a set of connected points referred to herein as a centerline of the vortex. The centerlines for each vortex and the location of the vortices can be generated using various techniques. For example, in a three-dimensional simulation, a $\lambda_2$ criterion (e.g., a criterion used to identify a vortex region as a region where the second eigenvalue $\lambda_2$ ($\lambda_1 \geq \lambda_2 \geq \lambda_3$) of the symmetric tensor ($\Omega_2 + S_2$) is negative at every point inside the vortex core) can be used to identify regions in the simulated system likely to include a vortex. The regions identified as being likely to include a vortex collectively can be represented as an isosurface that includes regions having $\lambda_2$ values that fall below a threshold manually imposed or automatically determined by the method. Thus, the identified isosurface will include multiple regions within the simulation space and will contain all of the vortices satisfying the threshold condition. Further computation of the isosurface can be completed to identify self-contained portions of the isosurface associated with distinct vortices. For example, a flooding algorithm can separate non-touching clumps of voxels (such that each clump corresponds to one vortex/one group of touching vortices) and subsequently an algorithm can split big clumps of voxels in smaller clumps such that each clump represents a single vortex (the subdivision process can be repeated more than once). In some examples, clumps of voxels containing less than a threshold number of voxels, or having a maximum circulation less than a threshold number, can be removed (e.g., to remove negligible vortices from consideration). Once such self-contained isosurfaces have been identified, an algorithm can be used to triangulate or otherwise determine a centerline for each of the identified vortices. As described in more detail below, other quantities such as vorticity and/or a Q-criterion can be used to identify the vortices.

Once the set of vortices in the system has been identified for at least two time frames in the fluid flow simulation, the method includes a spatial tracking of the vortices by comparing the identified vortices at two different time steps (12). More particularly, an algorithm matches—if possible—each of the vortices at the first time step with an associated vortex at the second time step based on their centerline representations. In addition, the algorithm determines whether a particular vortex in the second time frame is an instantiation of a previously identified vortex, a new vortex, a split of the vortices into multiple new vortices, or a merge of multiple vortices in a new single vortex. By tracking the motion of each of the vortices, information about the size, velocity, intensity, stretching, direction of movement and any dynamic information regarding each vortex is generated.

Using the tracking information, the system identifies simple or complex systems of vortices that are likely candidates for noise producing vortices (14). More particularly, co-rotating systems or vortices with a high stretching rate are more likely than other vortices to produce noise. As such, based on the tracking information vortices or systems of vortices satisfying these characteristics (e.g., co-rotating vortices and vortices undergoing stretching by getting longer or shorter or being twisted) can be identified based on the size, velocity and direction of movement information.

After the vortices and systems of vortices have been identified, the system models the noise produced by the vortices (16). The noise modeling includes a reconstruction of the frequency, amplitude, location, directivity, and radiated power for each source and for the overall system composed of all individual sources. In case of co-rotating vortices, all the previous information is reconstructed based on a theory of the vortex sound derived from a generalization of Powell's theory. This theory makes the link between the vortex dynamics (e.g., rotation speed, growth rate, and/or relative motion) and the noise generation. In case of stretching vortices, the tracking algorithm coupled to a dipole-like noise modeling derived from Powell's theory gives access to the stretching noise contribution. This contribution is related to the evolution of the shape, length, intensity, circulation, and the deformation rate of the vortex structures.

The system also performs post-processing operations on the determined noise information to extract and display useful features of the information to the operator of the system (18). For example, post-processing of the data can be used to generate a density map of the noise producing structures. For example, the noise data from multiple different time frames can be summed to generate a density map that shows the frequency of a noise producing structure based on the noise produced by the co-rotating vortices and the stretching vortices. In another example, post-processing can be used to identify places with a high count of noise producing structures. In another example, the noise data from multiple different time frames can be summed up to generate a time-averaged radiated acoustic power map based on the noise produced by the co-rotating vortices and the stretching vortices. In another example, post-processing can be used to filter the noise producing structures by a direction to see a density and count of the noise producing structures, but only for the noise directed in a particular direction. In another example, the data can be post-processed based on a frequency such that only certain frequencies of noise are displayed to the user. In another example, information on the sources can be coupled to the flow data to identify and locate regions of the surrounding geometry responsible for the generation of the noise (such as steps, gaps, and/or sharp edges).

Overview of Powell's Theory of Vortex Sound

Figure 2A:
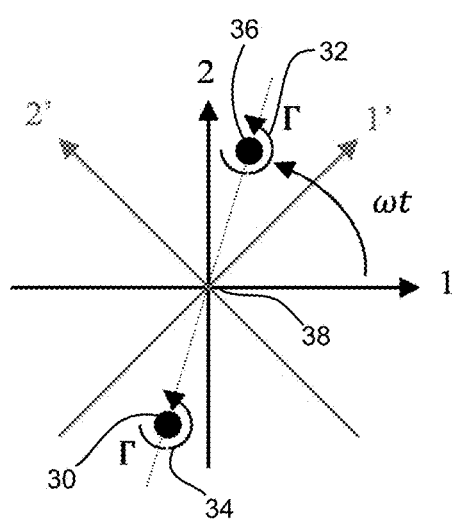
FIG. 2A shows a schematic representation of a co-rotating vortices (CRV) system.

As noted above, one method to determine sound generated in a system can be based on an application of Powell's Theory of Vortex Sound. In free flows, the flow-induced sound is considered to be generated by the motion of vortices. There are no momentum changes, since no solid surfaces are present, which implies that when a change in vorticity occurs somewhere in the flow, the opposite change occurs somewhere else. Each vortex experiences a change in strength and shape, which in both case, generate a dipole-like radiation. The following general expression for the far-field acoustics density fluctuations due to vortex motion can then be derived:

$$\rho'(\vec{x}, t) \approx -\frac{\rho_\infty}{4\pi c^4 x} \frac{(x_i x_j)}{x} \frac{\partial^2}{\partial t^2} \int_V y_j (\vec{\omega} \times \vec{u})_i dV(\vec{y}) \quad (1a)$$

with $y_j$ the projection of the integration vector $\vec{y}$ on $\vec{e_j}$, $\vec{x}$ the observer position vector, $\vec{\omega}$ the vorticity vector and $\vec{u}$ the velocity vector. $dV(\vec{y})$ is the elementary volume of fluid. $\rho_\infty$ is the mean density and c is the speed of sound. A discretization of the volume of integration V in terms of vortex corelines elements is used and a new expression for far-field density fluctuations is derived from Eq. 1a:

$$\rho'(\vec{x}, t) \approx -\frac{\rho_\infty}{4\pi c^4 x} \frac{(x_i x_j)}{x^2} \frac{\partial^2}{\partial t^2} \sum_{k=vortex} (y_k)_j (\vec{\Gamma}_k \times \vec{u}_k)_i \Delta l_k \quad (1b)$$

with k representing one sub-element of one unique discretized vortex coreline. A system of two co-rotating vortices 30, 32 distant by 2y with the same circulation $\Gamma$ (represented by arrows 34 and 36, respectively) as represented in FIG. 2A is now considered. Such a system induces the rotation of the vortices around an axis O (38) at the angular velocity $\Omega_s = \Gamma/(4\pi y^2)$ for which $\Gamma$ and y are constants. By using this angular velocity in Eq. 1b, the density fluctuations are now given by:

$$\rho'(\vec{x}, t) \approx -\rho_\infty 4\sqrt{\pi} \sqrt{\frac{\Delta l}{R}} \cos(2(\vec{x}, \vec{e_1}) - 2\Omega_s t^* + \frac{\pi}{4}) \left(\frac{\Omega_s y}{2c}\right)^{\frac{7}{2}} \quad (2)$$

with $\Delta l$ the length of the vortex coreline element. We suppose $\Delta l \ll \lambda$ so that time delay of the acoustic waves is neglected, with $\lambda$ the acoustic wavelength. The unit vectors used in Eq. 2 are described, for example, in FIG. 2A which provides a schematic representation of a co-rotating vortices (CRV) system. Consequently, the radiated sound power corresponding to this CRV system is:

$$P_{tot} = \oiint \frac{\langle \rho'^2(\vec{x}, t) \rangle c^3}{\rho_\infty} d^2 S = \frac{\rho_\infty \Delta l \pi^2 \Omega_s^7 y^7}{8c^4} \quad (3)$$

Powell's theory neglects viscous effects (discussed below) and as a consequence a perpetual motion of the CRV occurs. The equivalent acoustic system is a rotating quadrupole composed of four constant pressure poles rotating around an axis.

Sound is also generated by the change in strength of vortices in the flow. For example, Aeolian tones are produced by the stretching of vortex rings and the radiated noise is equivalent to dipole radiation. However, such changes in strength do not occur isolated in the flow and an opposite stretching is likely to be found at a delayed period in time, resulting in a shedding. Consequently, an oscillating quadrupole-like noise source is to be found. Powell also developed the theory for the dipole-like radiation. The corresponding equation for fluctuating velocity is:

$$\vec{u}(\vec{x}) = -\frac{\vec{x}}{4\pi x^2 c^2} \int \mathcal{L}'_x dV(\vec{y}) \quad (4)$$

with $\vec{\mathcal{L}} = \vec{w} \times \vec{u}$ then Lamb vector and $$\mathcal{L}'_x = \frac{\partial (\vec{\mathcal{L}} | \vec{e_x})}{\partial t}.$$

In vortex stretching, the sound radiation occurs because the acceleration of a vortex element in a direction normal to its axis causes a local fluctuating dipole-like flow (obtained through space integration of the time derivative of the Lamb vector).

Extensions of Powell's Theory

In Powell's theory, vortices are represented through their circulations and locations centered on a spinning axis. In order to take into account for the variation in both size and circulation of vortices, the Scully vortex model is used for the rotational velocity:

$$V_\theta(r) = -\frac{\Gamma r}{2\pi (r_c^2 + r^2)} \quad (5)$$

The difference in strength of the two vortices has an impact on the rotating system. Considering two vortices (e.g., vortices 50, 52 in FIG. 2B) with different circulations, according to the parameters defined in FIG. 2B, the angular velocity of the system is:

$$\Omega = \frac{\Gamma_1 + \Gamma_2}{2\pi b^2} \quad (6)$$

The position of the center of rotation is given by:

$$x_o = \frac{\Gamma_1 x_1 + \Gamma_2 x_2}{\Gamma_1 + \Gamma_2}, \quad y_o = \frac{\Gamma_1 y_1 + \Gamma_2 y_2}{\Gamma_1 + \Gamma_2} \quad (7, 8)$$

Starting from Eq. 1b and using the geometrical parameters of the system (FIG. 2B), the density perturbations and acoustics power become:

$$\rho'_{12}(\vec{x}, t) \approx -\frac{\rho_\infty}{8\pi^2 c^4} \frac{1}{(R^2 + Z^2)^{\frac{3}{2}}} \quad (9)$$
$$R(2R\cos(2\theta - 2\Omega_s t^*) + Z\cos(\theta - \Omega_s t^*))\Delta l \Omega_s^2 \Gamma_1 \Gamma_2$$

$$P_{tot} = \frac{17 \rho_\infty \Gamma_1^2 \Gamma_2^2 \Delta l^2 \Omega_s^4}{240 \pi^3 c^5} \quad (10)$$

with R, $\theta$ and Z the cylindrical coordinates of x in the frame of reference of the CRV system.

Figure 2B:
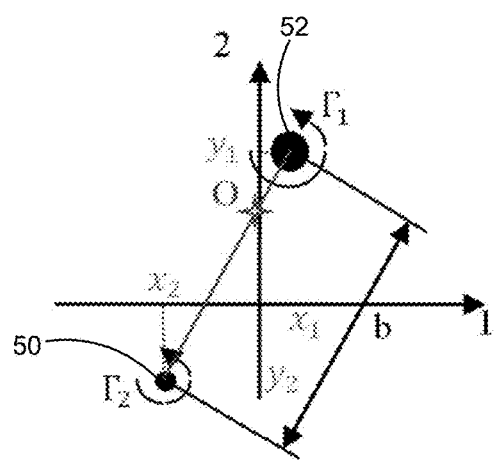
FIG. 2B shows a CRV system with different strength circulations.

This assumes the shape of the vortices stays coherent (i.e. well approximated by a point model). If the ratio of the circulations is above a certain threshold, more complex viscous effects happen introducing noise generation through changes in size of the low circulation vortex. FIG. 2A shows an exemplary schematic representation of a co-rotating vortices (CRV) system and FIG. 2B shows an exemplary schematic representation of a co-rotating vortices system with different strength circulations.

When viscous effects are taken into account, more complex mechanisms are involved and the CRV vortex pair eventually merges. The merging process consists of four stages:

First diffusive stage,
Convective stage,
Second diffusive stage,
Final diffusive stage.

Figure 3:
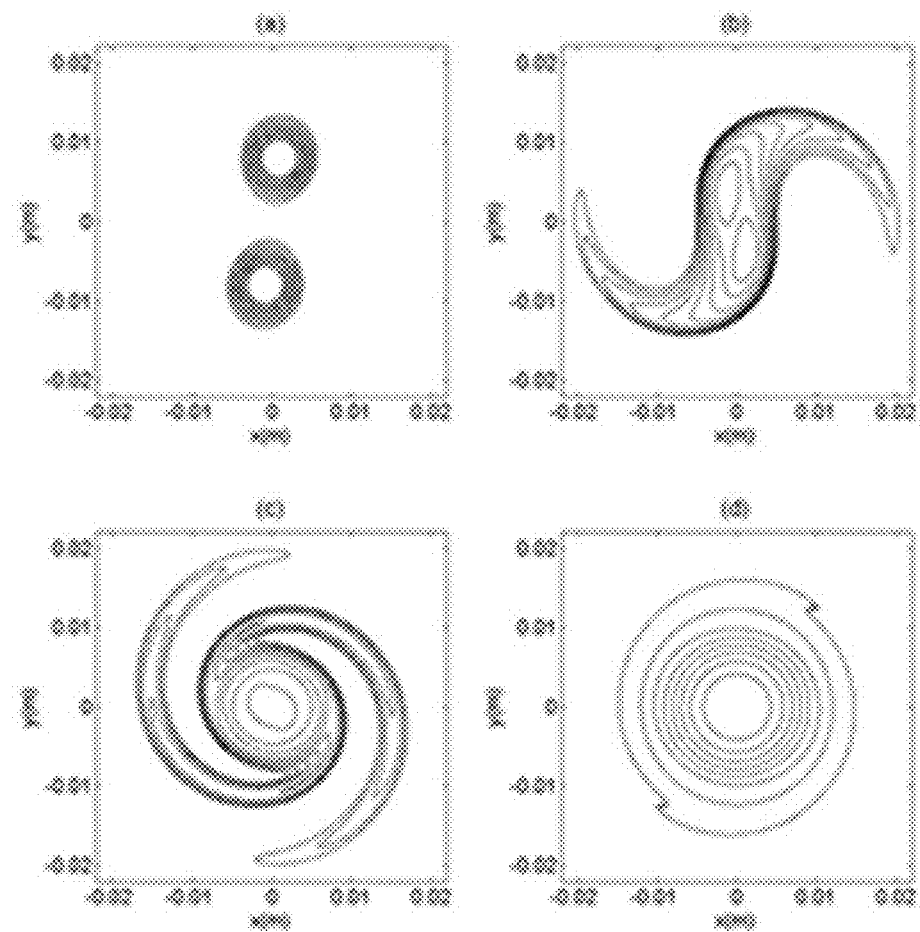
FIG. 3 shows a schematic representation of a merging process for a co-rotating vortices system.

The first diffusive stage corresponds to the diffusion of each vortex due to its rotation and the viscosity of the fluid, which causes an increase of their core radii following a square root law $r_c(t)=r_c(0)+c\sqrt{v(t-t_0)}$. During this stage, the quadrupole analogy of Powell can be successfully applied. The convective stage starts when the core radius reaches a critical value such as $r_{c\ critical}=0.290b_0$ with $b_0=2y_0$ the initial distance between the two vortices. The coefficient in front of b0 depends on the precise setup conditions. The duration $t_c$ of the convective stage in case of laminar vortices is known from experiments: $t_c=8.1*(b_0^2/\Gamma_0)$. The distance between the vortices decreases during this stage and diffusion plays only a minor role. Also during this stage, the rotation speed increases, creating a non-symmetric vorticity field giving birth to vorticity filaments. The second diffusive stage corresponds to the period necessary for the vortices to merge (b=0), and the final diffusive stage is the diffusion of the resulting single post-merge vortex. The four stages are illustrated in FIG. 3, obtained from LBM simulations of the CRV system described herein. FIG. 3 shows the Instantaneous vorticity field $\Omega$ [s^(-1)] obtained from a LBM CRV simulation at (a) first diffusive step, (b) convective step, (c) second diffusive step, (d) final diffusive step.

Noise Source Identification

The flow-induced noise identification method (FINSIM) approach described herein identifies and tracks the vortex structures responsible for sound generation in arbitrarily complicated flows of real industrial cases. The vortex structures of interest are co-rotating vortex (CRV) pairs and vortices undergoing stretching (e.g., at a non-uniform rate). For the CRV sources, FINSIM identifies each relevant vortex pair as a discrete CRV system and determine the equivalent quadrupole-like sources and corresponding acoustic radiation. By studying the motion of the entire flow field of vortices, the complete quadrupole-based far-field noise can be estimated, and properties of the physical noise sources can be analyzed. The proposed tracking scheme is valid during the first diffusive stage and the beginning of the convective stage of the CRV motions, which are believed to be the most important mechanisms for noise generation.

Figure 1B:
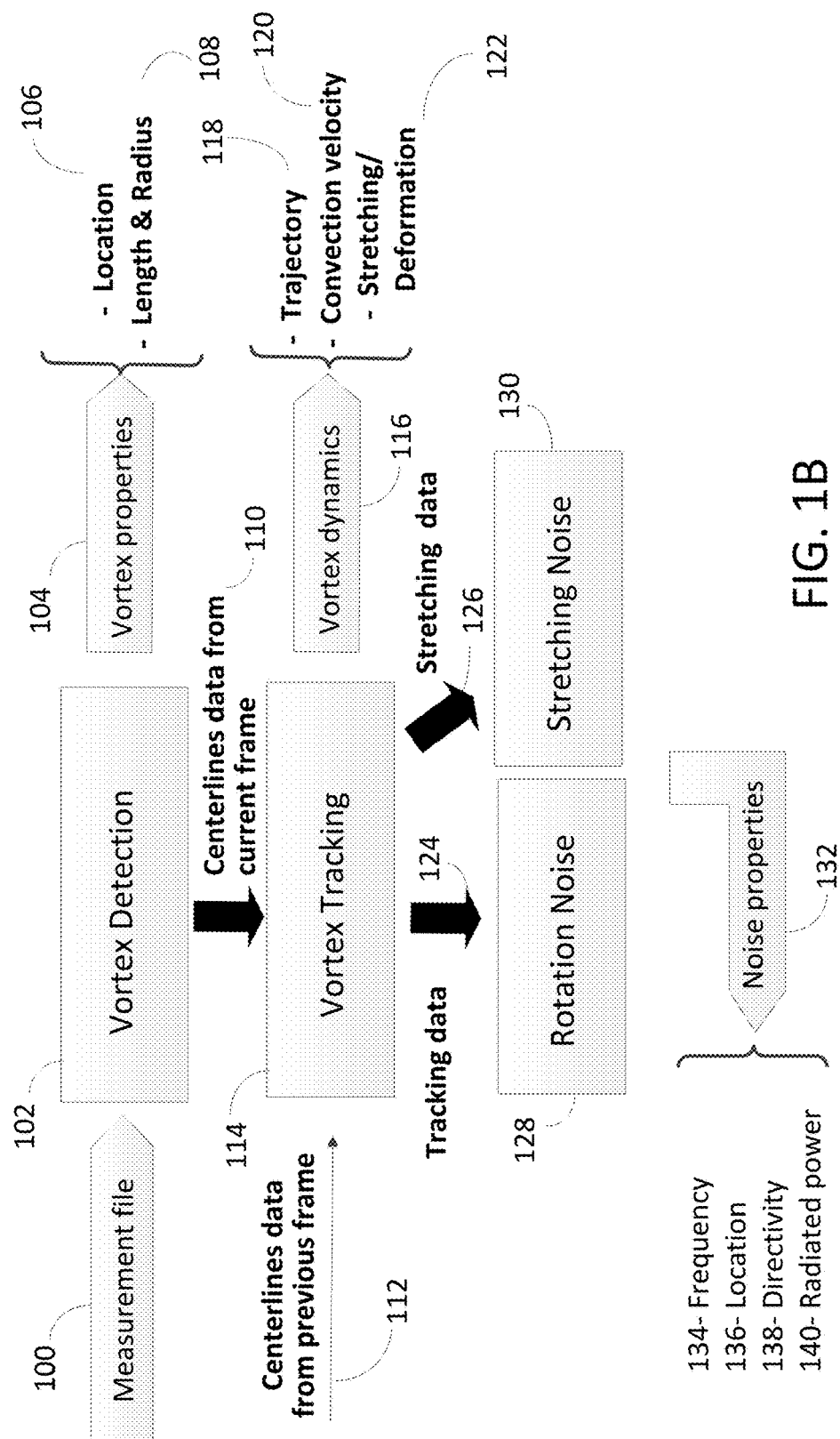
FIG. 1B shows a flow chart of a process for flow-induced noise identification.

Referring to FIG. 1B, a flow diagram for the flow-induced noise identification method (FINSIM) approach is shown. At a high level, the FINSIM approach includes vortex detection 102, vortex tracking 114, and noise modeling 128/130 to generate noise properties 132.

The vortex detection 102 portion of the FINSIM approach is used for the identification of vortices. The identification of vortices can be based on instantaneous pressure, vorticity, Q-criterion, λ2-criterion or other methods able to identify discrete vortices in a transient and turbulent flow. In two dimensions, vortices can be extracted based on the vorticity. For 3-D cases, the use of the λ2-criterion is likely more suitable.

Figure 1C:
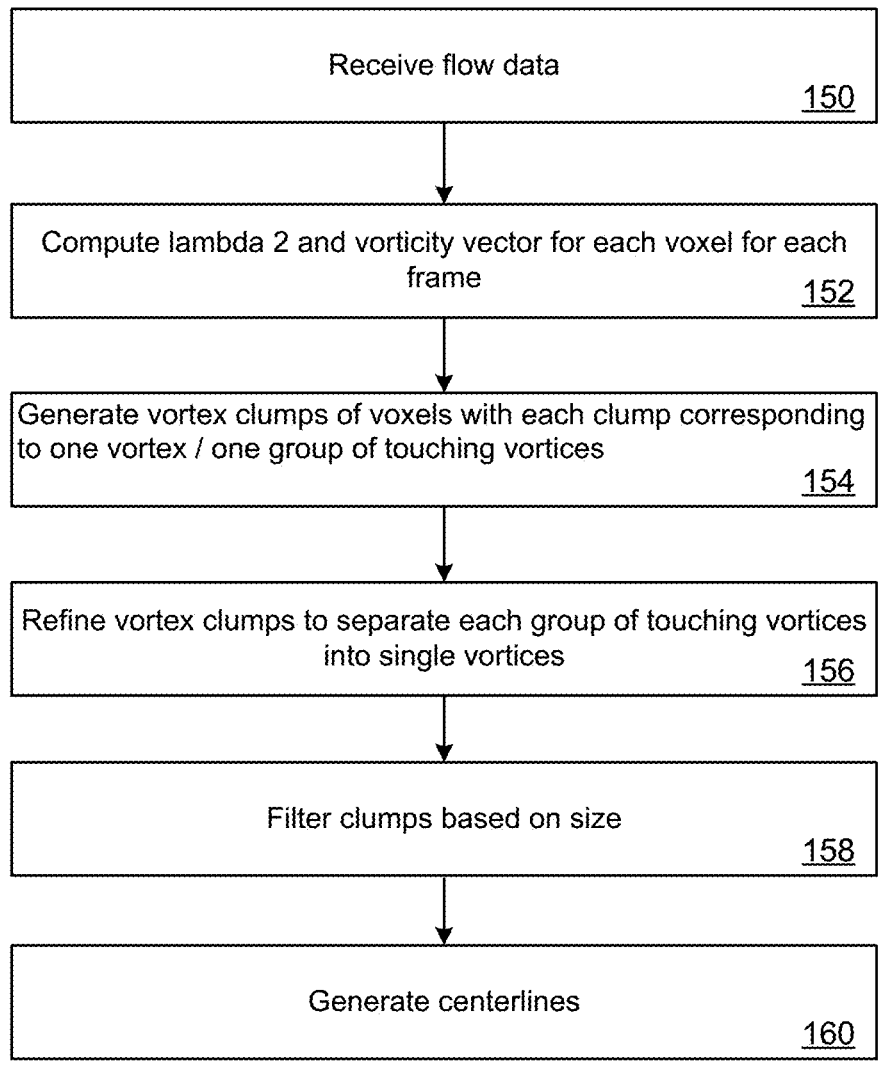
FIG. 1C shows a flow chart of a process for flow-induced noise identification.

More particularly, as shown in FIG. 1C, the vortex detection process 102 receives a measurement file 100 from a flow simulator (150). The measurement file includes information about the flow of particles in each voxel (or in a subset of voxels for an identified region) in the system including pressure and velocity vector minimum. The measurement file includes one or more frames (e.g., separate time steps in the simulation) of flow data. Based on the flow data, the system computes $\lambda_2$ and vorticity vector for each voxel for each frame (152). These values can be used to locate a vortex. For example, a low value of $\lambda_2$ is likely to be close to the centerline of a vortex. The $\lambda_2$ and vorticity vector are then used to generate vortex clumps of voxels (e.g., an isosurface) with each clump corresponding to one vortex/one group of touching vortices (154). To generate the clumps of voxels, the system compares the values for the $\lambda_2$ and vorticity vectors to pre-determined thresholds to select a subset of voxels having $\lambda_2$ and vorticity vectors with values in a pre-determined range. The initial clumps of voxels can include overlapping vortices, so the system refines vortex clumps to separate each group of touching vortices into single vortices (156). In order to remove small vortices, (e.g., vortices less than a threshold size), the system filters clumps based on size (158). For remaining clumps of voxels, the system generates a centerline for each clump of voxels (160). The centerline information includes various vortex properties 104 such as location 106 and length and radius 108.

The vortex tracking portion 114 of the FINSIM approach identifies the displacement of each vortex. In this portion, the parameters of all vortices (location, radius, circulation, etc) at discrete time $t_i$ and $t_{i+1}$ are computed and a tracking algorithm identifies the displacement of each vortex between $t_i$ and $t_{i+1}$. More particularly, a tracking algorithm receives centerline data from a current frame of the simulation 110 and centerline data from a previous frame of the simulation 112. Based on these two sets of centerline data, the tracking algorithm generates vortex dynamic information 116. This includes trajectory information 118, convection velocity 120, and information about stretching/deformation of vortices 122. Based on the vortex dynamic information 116 the tracking algorithm can output tracking data associated with co-rotating vortex pairs 124 and stretching data 130 associated with vortices undergoing stretching. Identifying the co-rotating vortex pairs can include, for example, analyzing the vortex system motion. The identification of each CRV system is based on the calculation of the position and displacement of each vortex and the determination of their closest neighbors. The vortex and their neighbors are then considered as discrete CRV systems. The number of candidate CRV systems is reduced by discarding systems which inter-vortex distance is above a distance threshold. The self-rotation information of the CRV system is extracted from its dynamics and used for modeling.

Identifying the stretching vortices can include, for example, computing the growth rate of individual structures length or circulation (information known from the structure identification procedure). From the change in length or strength of the vortices, stretching vortices are detected.

The noise modeling portion(s) 128, 130 of the FINSIM approach derive the noise generated by the identified vortices. More particularly for each CRV, based on its dynamics, the resulting generated noise is derived according to the extended Powell's theory. Noise generation due to vortex stretching is also derived. The noise modeling generates a set of noise properties for the system (e.g., a summation or compilation of the noise properties for each noise producing vortex in the system). The noise properties can include the frequency 134, location 136, directivity 138, and radiated power 140 for vortices in the system. The noise properties can be identified and associated with locations in the simulated system. For example, the noise properties for each voxel in the system can be determined. The frequency information 134 is important because some frequencies of sound are more likely to cause disturbance while other frequencies may be outside of the spectrum that can be perceived by human ears. The location information 136 can be useful to identify places within the system that generate noise. This information can be used to trace back to noise producing structures in the physical design of the object being simulated. The physical location in the design responsible for the inducing noise vortices can be determined, for example, by implementing a reverse problem. Knowing the location of a noise source in the flow, it is possible to identify where the vortices responsible for sound were originally generated using, for example, the mean flow streamlines, the vortex trajectory or a reverse particle-tracking algorithm. The location information can be displayed as a graph with the voxels having noise producing vortices identified on the graph. The directivity information 138 for vortices can also be important. For example, if a side mirror on a car is generating noise but the noise is directed away from the car rather than toward the window the impact of the noise to the comfort of the individuals in the car may be reduced and therefore the noise may be less of a concern. Finally, the radiated power or amplitude of the noise 140 is important because the tolerance for certain levels of noise may make changes to the system unnecessary if the level of noise falls below a threshold.

While not shown in FIG. 1B, post processing of the noise data can be beneficial to provide understandable and useful information to a user. For example, based on the results generated for the predicted flow and radiated noise useful metrics, displays, and information can be presented to the user. These can include information and statistics about vortex locations and convection speeds, characteristic vortex lifetime, vortex stretching behavior, instantaneous radiated frequencies, noise source locations and strength, frequency-dependent intensity maps, etc.

In one example, post processing can be used to generate a graph of the vortex locations and convection speeds. This map provides an indication of the convection speed by coloring or otherwise providing a visual indicator of the convection speed for each voxel. Locations for which there are no vortices present will be similarly colored to indicate the absence of vortices (e.g., because there will be no associated convection speed or the convection speed will be below a threshold). In some examples, the map of vortex location convection speed is displayed for a single time point while in other examples a time evolution of multiple time frames is provided.

In another example, post processing can be used to generate a graph of the vortex locations by providing a visual representation of the centerline locations. For example, the centerlines can be displayed on the representation of the system by an appropriate visual indicator within the voxel. Since a centerline will span multiple voxels, the centerlines for voxels will be displayed by providing the appropriate indicator in each of the voxels. Additionally, the strength or the amplitude of the noise radiated by the centerline can be visually indicated. For example, if the centerline is represented by a line at the appropriate location(s), the width or coloring of the line can provide information about the amplitude of the sound produced by the vortex. Such information can be displayed for a single time step in a simulation or as a time-based evolution spanning multiple time steps.

In another example, post processing can be used to generate a graph of the frequency of sounds produced within a system. For example, a graph of the noise source density (e.g., the number of vortices within the system) versus the frequency of sound produced by the vortex can be generated. In another example, a graph of the radiated acoustic power (e.g., the time-averaged acoustic power generated by the various system of vortices) versus the frequency of sound produced by the vortex can be generated. In some examples, multiple different designs are simulated and a comparison of the generated sound frequencies can be provided (e.g., a graph that includes information for both designs).

In another example, post processing can be used to generate a graph of the vortex locations and strength. This map provides an indication of the vortex strength by coloring or otherwise providing a visual indicator of the convection speed for each voxel. Locations for which there are no vortices present will be similarly colored to indicate the absence of vortices (e.g., because the strength will be below a threshold).

In another example, post processing can be used to generate a graph of characteristic vortex lifetime. For example, a graph of the distribution of vortices according to the total travelled distance can be generated. Turbulence in many designs can be an issue and the lifespan of coherent structures must be reduced to avoid mechanical fatigue or object indirect interactions. An appropriate design can be chosen by minimizing the travelling distance of vortices.

In another example, post processing can be used to generate a graph of vortex stretching behavior. For example, a plot of the stretching rate of vortices along a specific direction of the simulated object can be generated. In some designs, the turbulence in the flow, i.e. the vortices, must decay in intensity or size as fast as possible, and an efficient design can be determined by looking at the stretching rate distribution.

In another example, post processing can be used to generate a graph of instantaneous radiated frequencies. For example, a spatial map of noise sources colored by frequency can be generated, presented as a time animation. In some designs, the noise generated in the flow can reach unauthorized level, corresponding to peaks in the SPL graph of a far-field probe. A map of the sources colored by frequency will help identify regions of the flow responsible for this specific tone and it will provide insight on the life cycle of the noise inducing vortices responsible for such levels through a time animation of the sources motion.

In another example, post processing can be used to generate a frequency-dependent intensity maps. For example, a graph can be generated to provide an indication of the vortex strength by coloring or otherwise providing a visual indicator of the convection speed for each voxel. The information on this graph can be filtered to display a user-selected range of frequencies. For example, the user may desire to display only frequencies that are detectable by the human ear or only high frequencies that may be perceived to be more disruptive to an individual's comfort. Filtering by frequency in the associated voxel based graph allows the user to focus attention on locations within the system that are generating the highest amount of noise within a frequency range of interest.

In another example, post-processing can be used to generate the graph of power over a range of frequency of interest. For example, the SPL graph of the mean power during the simulation time of all sources within a defined region can be generated. For some objects, the flow-induced noise can originate from several locations in space. In the far-field, it can be difficult to pinpoint which quantity of acoustic power comes from which region, and computing this information helps a better design process by prioritizing parts of the object that need modifications for noise reduction.

In another example, post-processing can be used to generate the directivity of power for a specific region. For example, the distribution of time-averaged acoustic power over a sphere centered on a specific region of interest can be generated. When designs are compared, not only the total amount of power radiated is important but also its directivity. Depending on the direction, the radiated acoustic power can be of interest, i.e. a direction where the noise needs to be reduced, or it can be negligible, i.e. a direction where the noise has no importance.

In another example, post-processing can be used to generate the reconstruction of acoustic signals at various points in space. For example, the pressure acoustic field on any surface can be visualized or used to quantify the amount of acoustic power transmitted. In the flow region, the acoustic pressure field is not directly available as it can be hidden in the hydrodynamic pressure field fluctuations. Filtering is difficult and can be contaminated by numerical noise. Using the modeling of noise sources, the acoustic filtering can be performed with the reconstruction of the acoustic pressure field at any point of interest in the flow region.

In another example, post-processing can be used to generate a surface map of the noise source origin. For example, the surface of the object can be locally colored by the number of flow induced noise sources which originated from the location of interest. In some designs, specific regions of the surface responsible for noise generation need to be highlighted before being corrected. By modifying the highlighted pieces of surface, the noise sources can be decreased in intensity and the design improved.

Lattice Boltzmann Method (LBM)

As noted herein, various types of flow simulations can be used to generate the flow information used to identify and track vortices. One such flow simulation is based on the Lattice Boltzmann Method. A CFD/CAA code is used to compute unsteady flow physics. The code is based on the Lattice Boltzmann Method (LBM). Lattice based methods were proposed as an alternative numerical method to traditional Computational Fluid Dynamics (CFD). Unlike conventional methods based on discretizing the macroscopic continuum equations, LBM starts from "mesoscopic" kinetic equations, i.e. the Boltzmann equation, to predict macroscopic fluid dynamics. The lattice Boltzmann equation has the following form:

$$f_i(\vec{x}+\vec{c_i}\Delta t, t+\Delta t) - f_i(\vec{x},t) = (\vec{x},t) \quad (11)$$

where $f_i$ is the particle distribution function moving in the $i^{th}$ direction, according to a finite set of the discrete velocity vectors $\{c_i: i=0,\ldots b\}$, $c_i\Delta t$ and $\Delta t$ are respectively space and time increments. For convenience, we choose the convention $\Delta t=1$ in the following discussions. For the collision term on the right hand side of Equation (11) the simplest and most common implementation is the Bhatnagar-Gross-Krook (BGK) form:

$$C_i(\vec{x}, t) = -\frac{1}{\tau}[f_i(\vec{x}, t) - f_i^{eq}(\vec{x}, t)] \quad (12)$$

Here $\tau$ is the relaxation time parameter, and $f_i^{eq}$ is the local equilibrium distribution function, which follows the Maxwell-Boltzmann form. The basic hydrodynamic quantities, such as fluid density ρ and velocity u, are obtained through moment summations:

$$\rho(\vec{x}, t) = \sum_i f_i(\vec{x}, t), \quad (13, 14)$$

$$\rho\vec{u}(\vec{x}, t) = \sum_i \vec{c_i} f_i(\vec{x}, t)$$

In the low frequency and long-wave-length limit, for a suitable choice of the set of discrete velocity vectors, the transient compressible Navier-Stokes equations are recovered as shown by Chapman-Enskog expansion. The resulting equation of state obeys the ideal gas law, and the kinematic viscosity of the fluid a is related to the relaxation time parameter τ and the temperature T:

$$v = \left(\tau - \frac{1}{2}\right)T \quad (15)$$

The combination of Equations (11-15) forms the usual LBM scheme for fluid dynamics. It is solved on a grid composed of cubic volumetric elements called voxels, and a Variable Resolution (VR) strategy is allowed, where the grid size changes by a factor of two for adjacent resolution regions.

Co-Rotating Vortices (CRV)

A. Numerical Setup

Figure 4:
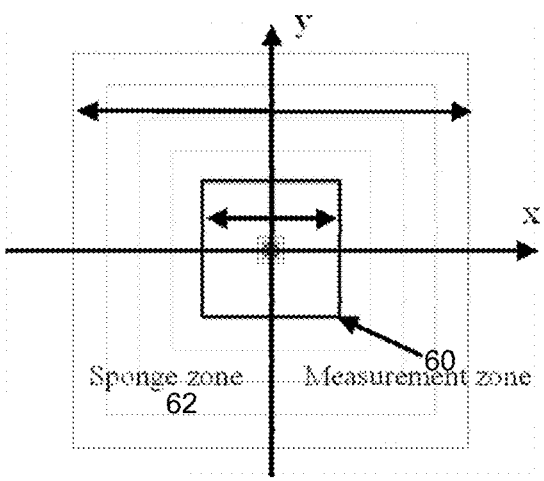
FIG. 4 shows a CRV simulation domain.

LBM Direct Numerical Simulation (DNS) are used to simulate a CRV system and two initial vortices are defined as an initial condition using Scully's model with a core radius $r_c=8\times10^{-4}$ m and a circulation $\Gamma=4\pi r_c v_{max}$ with $v_{max}=0.3$ m/s. The initial distance between the vortices is $b_0=1.6\times10^{-4}$ m and the Reynolds number Re based on $v_{max}$ and $r_c$ is Re=159. The simulation domain is a $2048 r_c$ square 60 (FIG. 4). The simulation domain 60 is surrounded by a sponge zone 62 consisting in several layers of fluid with increasing viscosity and resolution in order to avoid acoustic reflection at the boundaries. The boundary conditions on the exterior edges of the sponge zone are pressure outlets with non reflective conditions and the characteristic pressure is $p_0=101325$ Pa. The smallest voxel size is $\Delta x=r_c/30$. The *a priori* estimated wavelength of the CRV radiation being $\lambda=1000 r_c$ the simulation domain and the measurement region are large enough to capture the radiated acoustic field. The simulation is performed until the merging process is over, that is to say for $T=13.3\times10^{-3}$ s corresponding to 300,000 time-steps.

B. CRV Simulation Results and Analysis

FIG. 3 shows a schematic representation of a merging process for a co-rotating vortices system. In FIG. 3, the instantaneous vorticity fields are represented and the four stages of the CRV are recovered. The predicted angular velocity from a kinematic analysis is $\omega_0=208.3$ Hz. The converged value obtained after a short initial transient of the simulation (t=0.3 ms) is $\omega_{0-sim}=208$ Hz+/−3 Hz, in very good agreement with the theoretical value. The simulation vortex core radius as a function of time shows a square law dependency with an expansion coefficient α=2.3. From Cerretelli and Williamson, the value is α=2.24 for Lamb Oseen vortices while α=1.9 is found experimentally, which compare reasonably well to the predicted value.

Figure 5A:
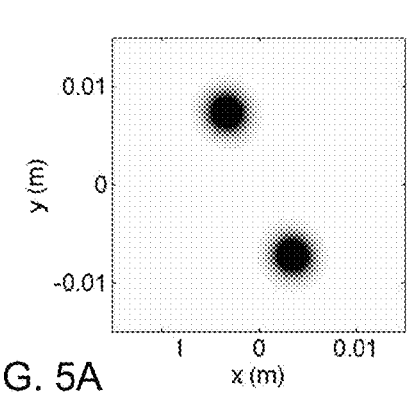
FIGS. 5A and 5B show fluid plane dB-maps for the time-evolution of two vortices.
Figure 5B:
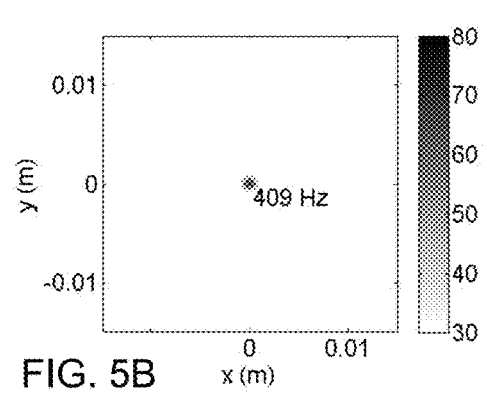
Figure 5C:
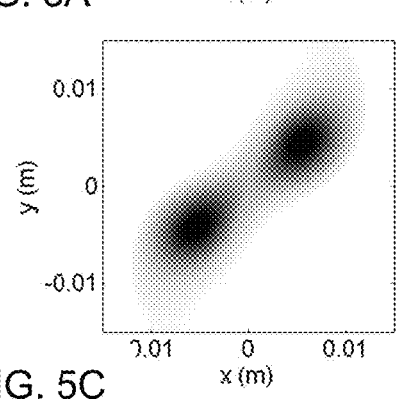
FIGS. 5C and 5D show instantaneous frequency and the strength of the noise radiated by the vorticity fields shown in FIGS. 5A and 5B.
Figure 5D:
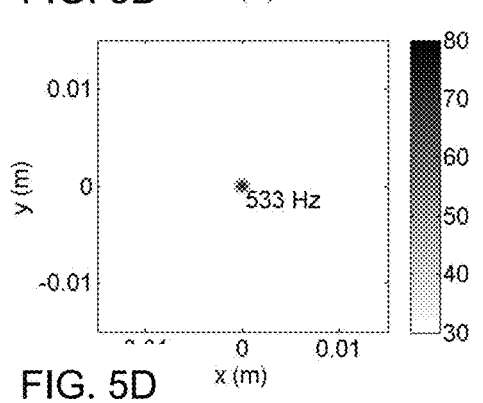

The complete time-evolution of the two vortices was analyzed to enable the desired quadrupole modeling, in particular the time-dependent characterization of the quadrupole noise sources. FIGS. 5A-5D show Vorticity isocontours ($s^{-1}$) and dB spatial map (dB) for co-rotating vortices with Re=159 with a) and b) are computed at t=0.91 ms. c) and d) are computed at t=6.38 ms. In FIGS. 5B and 5D, fluid plane dB-maps (i.e. images with voxels/areas colored by fluctuating pressure level) are shown highlighting the instantaneous frequency and the strength of the noise radiated by the vorticity fields plotted in FIGS. 5A and 5C, respectively. This representation shows the physical noise sources without any notion of directivity. It is observed that the frequency of the radiation is increasing with time as the two vortices get closer and closer and accelerate. The acoustic power is also increasing until the system collapses due to the merging process.

Figure 6:
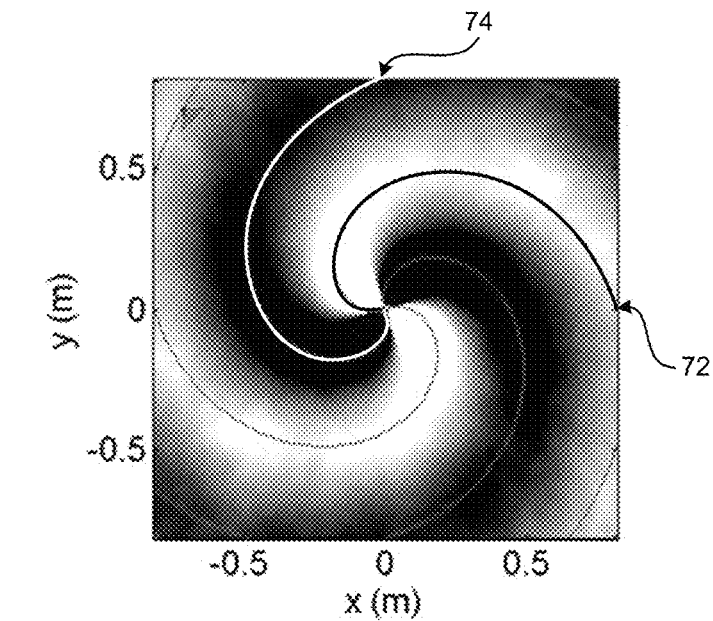
FIG. 6 shows an exemplary reconstructed radiated acoustic field.

The entire reconstructed radiated acoustic field is shown in FIG. 6. The comparison between the acoustic field obtained directly with the LBM simulations (in gray scale) and the pressure wave extrema calculated with FINSIM (represented by lines 72, 74) are in a satisfying agreement, which provides a validation of the algorithm for the noise modeling step. While this is only a 2D example, it shows that the concept (of predicting sound generation via CRV tracking) works. More particularly, in FIG. 6, the black and white shows the filtered acoustic pressure field in the range [−0.5 Pa,0.5 Pa] between 200 Hz and 1500 Hz predicted from LBM and lines 72, 74 correspond to minimum and maximum pressure wave values calculated with FINSIM.

2-D Shear Layer Flow

A. Shear Layer Flow

In previous studies it is shown that the noise generated by the main structures of a shear layer has a quadrupolar nature and is related to a vortex pairing mechanism very similar to the isolated CRV system. Here a two-dimensional forced shear layer at its first harmonic frequency $f_0$=40 KHz. is simulated in order to demonstrate FINSIM on a relatively simple case for which the crucial noise source dynamics and resulting sound field are known.

The Shear Layer (SL) problem is characterized by three parameters: the thickness $\delta_w(0)$, the maximum velocity $U_1$ and the minimum velocity $U_2$. The inlet velocity profile is given by:

$$u(y) = \frac{U_1 + U_2}{2} + \frac{U_1 - U_2}{2}\tanh\left(\frac{2y}{\theta}\right) \quad (16)$$

with $\theta=\delta_w(0)$. In the case of the forced shear layer, a sinusoidal forcing component is added to $\theta$ such as $\theta=\delta_w(0)(1+0.8 \sin(2\pi f_0 t))$. The corresponding Reynolds number is Re=250 with $\delta_w(0)$=4.34×10$^{-5}$ m.

Figure 7:
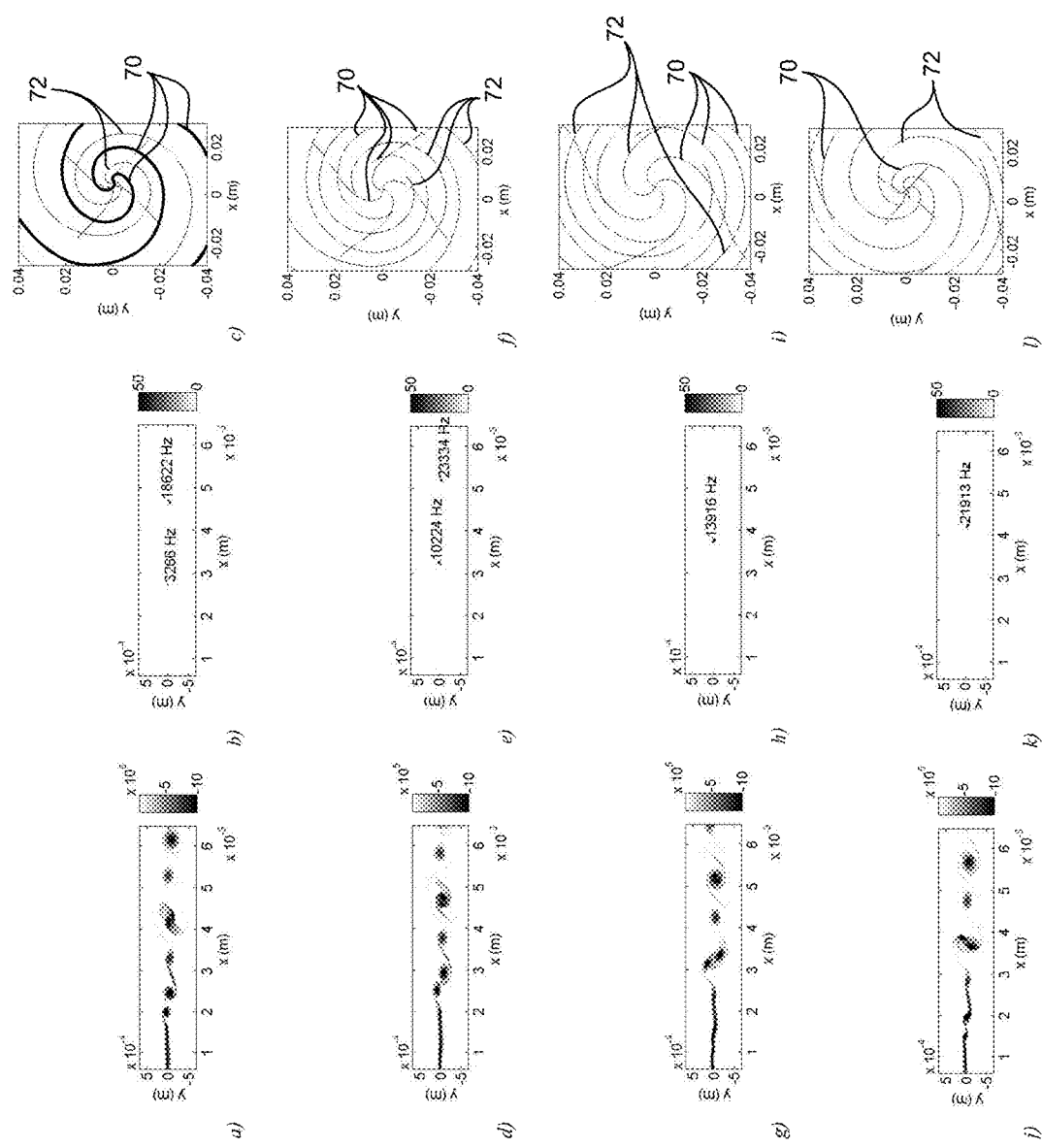
FIG. 7 shows an exemplary simulation of flow and acoustic fields corresponding to four points in time.

The simulation domain extends over $9600\delta_0(0)$ in the y-direction and over $8800\delta_w(0)$ along x. Sponge zones are again used to provide an anechoic condition. 2-D DNS simulations are performed over 80 cycles, i.e. 80 primary pairings. As shown in FIG. 7 for the forced SL, the flow is periodic, and the detection method is applied at four instants in time during one pairing period of two consecutive vortices generated in the SL. The time-dependent flow results are processed with FINSIM and the quadrupolar noise sources are recovered and can be explicitly associated to the pairing mechanism (FIG. 7). The main radiated frequency corresponding to the pairing frequency is also recovered showing a dependency on time and space. More particularly, FIG. 7 shows flow and acoustic fields corresponding to four points in time within one pairing period of the forced shear layer flow. From top to bottom: t=0 s; t=0.146 s; t=0.151 s; t=0.161 s. The graph on the left shows isocontours of vorticity in s−1, the graph in the middle shows instantaneous spatial dB-maps of noise sources and the graph on the right shows reconstructed acoustic field where lines 72 are pressure wave minima and lines 70 are pressure wave maxima.

3-D Jet Flow

A. Numerical Setup

Jet flow is an important source of noise in numerous applications, from aerospace to heavy machinery. While the mechanisms of noise generation (turbulence generation and vortex-to-vortex interaction) have been extensively analyzed by many researchers, the influence of geometric design details on how and where exactly the noise is generated is not explicitly understood. Therefore jets provide a compelling example for noise source identification.

Figure 11:
FIGS. 11 and 12 show a plot of reconstructed centerlines and error spheres, respectively.

Simulations of a round jet are performed on the CMS000 configuration (see for example FIG. 11). A large 3-D transient flow data set is generated to aid in the development and validation of FINSIM including the extension to 3D. The characteristic length is D=50.8 mm corresponding to the nozzle diameter.

The jet Mach number is M=0.35 and Reynolds number Re=410,000. The resolution is Δx=1 mm and physical time t=0.1 s of simulations are performed. Similarly to the previous 2-D cases, a sponge zone scheme surrounding the nozzle and the jet is used in order to avoid spurious reflections from the boundaries of the domain.

B. Flow and Noise Results

Figure 8B:
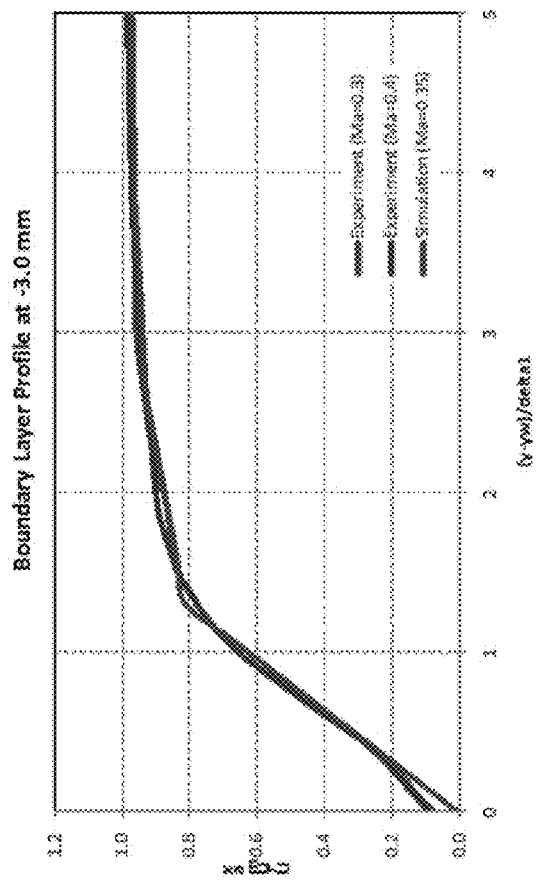
FIGS. 8A and 8B show the mean streamwise velocity component along the jet axis and streamwise velocity profile at 3 mm upstream of the nozzle exit, respectively.
Figure 8A:
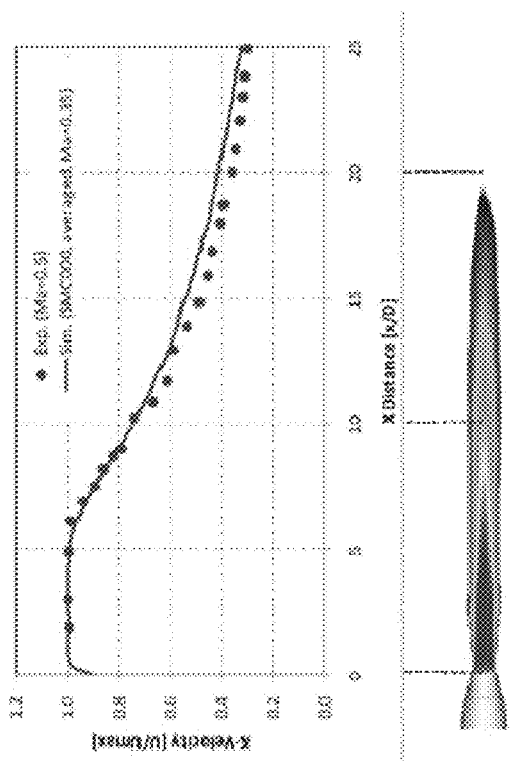
Figure 9:
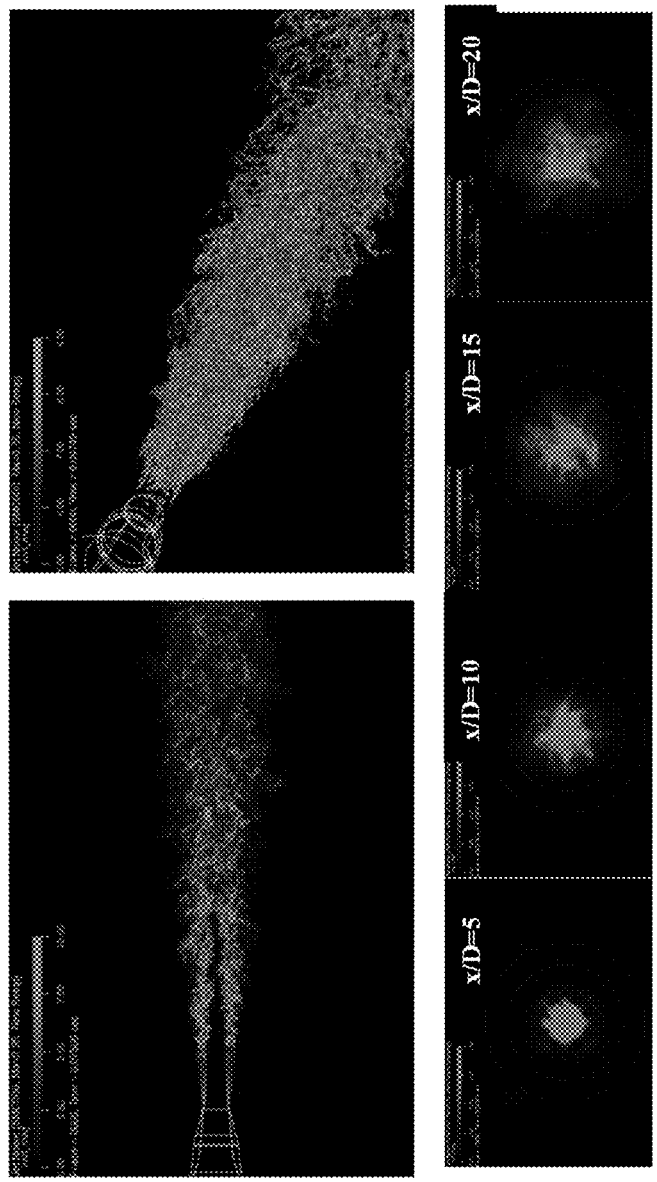
FIG. 9 shows the instantaneous vorticity field at various locations and planes.

FIGS. 8A and 8B show the mean streamwise velocity component along the jet axis and streamwise velocity profile at 3 mm upstream of the nozzle exit, respectively. In FIGS. 8A and 8B, the mean stream-wise velocity component is compared to experiments both along the jet axis, and the nozzle profile at 3 mm upstream of the exit. The predicted results are in good agreement with experiments. In particular, the boundary layer inside the nozzle is accurately predicted and the jet expansion, together with the potential core length are well recovered. Instantaneous snapshots of the vorticity field are represented in FIG. 9 showing the presence of a large number of vortices in the jet (FIG. 9 shows the instantaneous vorticity field at various locations and planes), including structures present in the shear layers and induced by the turbulent mixing of the jet at the end of the potential core.

Figure 10B:
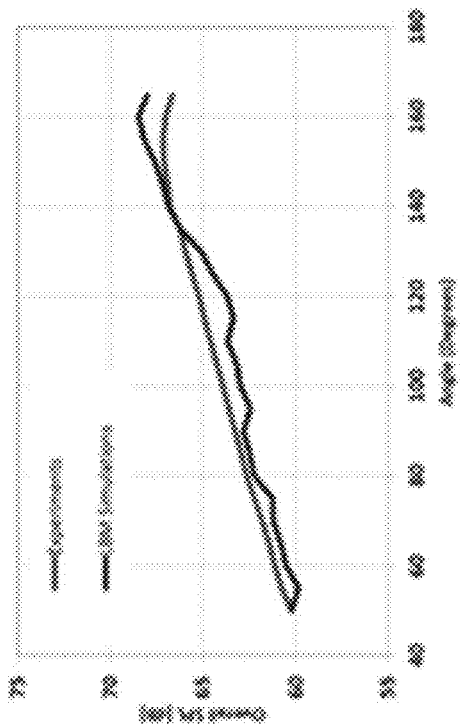
FIGS. 10A and 10B show a graph of instantaneous pressure fluctuations and an OASPL directivity plot, respectively.
Figure 10A:
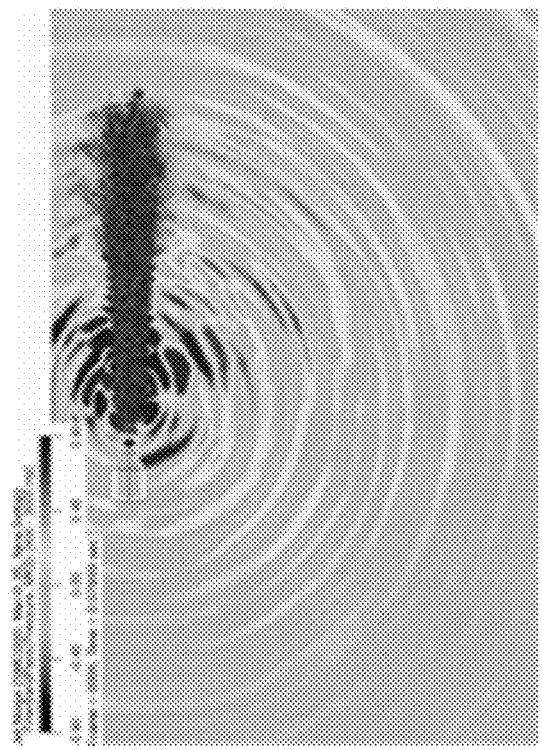

The acoustics radiation is captured within the same transient simulation and a snapshot showing the instantaneous pressure fluctuations is plotted in FIG. 10A with FIG. 10B showing instantaneous pressure fluctuations in an x-aligned plane. A main source of noise is visible in this figure, coming from the end of the potential core. The directivity of the overall sound level measured at microphones located 100D from the nozzle exit is shown in FIG. 10B with FIG. 10B showing OASPL directivity plot. The noise levels and the directivity dependence are well predicted and in particular the increase of the noise levels with increasing observation angle is obtained.

C. FINSIM Results

Figure 12:

The source identification method previously presented is adapted to 3-D transient inputs and used to analyze the sources of noise of the 3-D jet simulation. First, the simulation measurement files are input to the vortex detection method, which returns vortex core centerlines and other geometrical information about each vortex such as radius, location, length, etc. From the vortex centerlines and radii (i.e. the average radius of the λ-2 isosurface), the vortex structures are reconstructed in simplified form as visualized in FIG. 11 (e.g., showing the reconstructed centerlines). A high density of vortices is observed in the shear layer close to the potential core where vortices are produced. Vortices are then convected downstream, with vortex density decreasing due to merging and dissipation. In order to assess the accuracy of the vortex reconstruction process (which generates a "skeleton" version of each vortex), an error is computed based on the averaged distance of the initial isosurface envelope to the reconstructed mesh of the vortex. The average distance is then normalized by the equivalent radius of the individual skeleton. FIG. 12 shows the results of this computation, where each vortex is represented as a sphere with a radius that corresponds to the size of the error. The numerical values of this error metric generally stay under 1.0, and though peak values up to 3.0 are observed, the error levels are thought to indicate an acceptable accuracy for the reconstruction process. The peak values actually correspond to complex intertwined structures that are not individually captured by the first step of the process. If a single isosurface represents several blended vortices at the same time, FINSIM treats it as one, trying to fit a single tube to a complex system of vortices.

Figure 13:
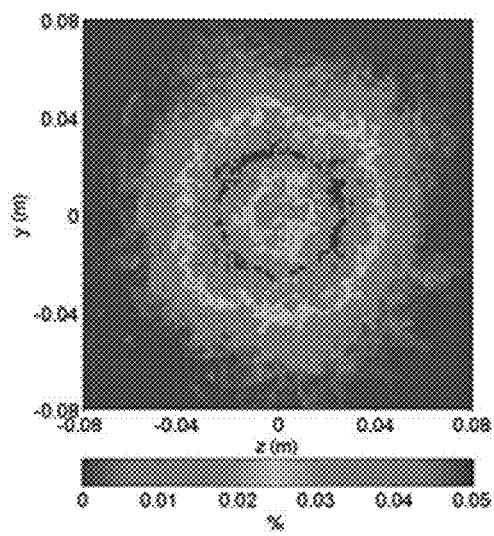
FIGS. 13 and 14 show a distribution of the vortices projected on the (x,y) plane and a distribution of vortex length along the x-axis, respectively.
Figure 14:
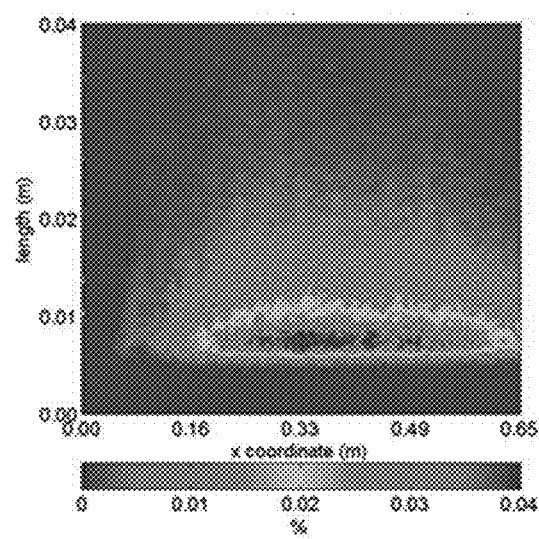

Vortex tube information, obtained for all frames, allow us to perform statistics on the turbulence in the flow. FIG. 13 shows a distribution of the vortices projected on the (x,y) plane. In FIG. 13, each vortex location from each frame is orthogonally projected on a 100 cells×100 cells grid centered on the jet axis, representing a total width of 3D. The fraction of vortices whose projection falls inside each individual grid cell is represented by the color of that cell. The resulting distribution of vortices shows the expected axisymmetry, as well as a strong concentration of vortices in the shear layer at the boundary of the potential core. The length of each vortex is also computed in the reconstruction process, and the distribution of vortex length along the x axis is shown in FIG. 14, which is constructed by partitioning vortex length into 100 values ranging from 0 to 0.04 m and streamwise location into 100 values between 0 and 15D. The distribution presented in FIG. 14 shows the low presence of turbulence before x=3D as well as the absence of vortices with length less than 0.006 m. The density of vortices is the highest between 3D (end of potential core) and 10D. The vortex length increases as they are convected downstream.

Figure 15:
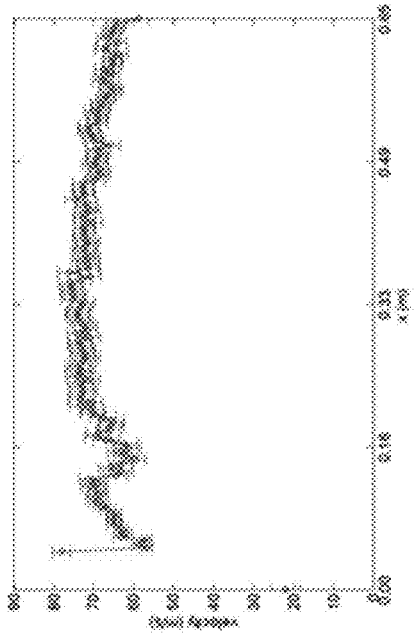
FIG. 15 shows an example of reconstructed centerlines.
Figure 16:
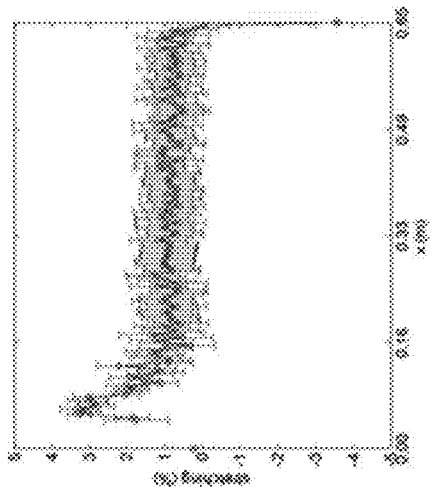
FIG. 16 shows an example graph of mean convection velocity along the x-axis.
Figure 17:
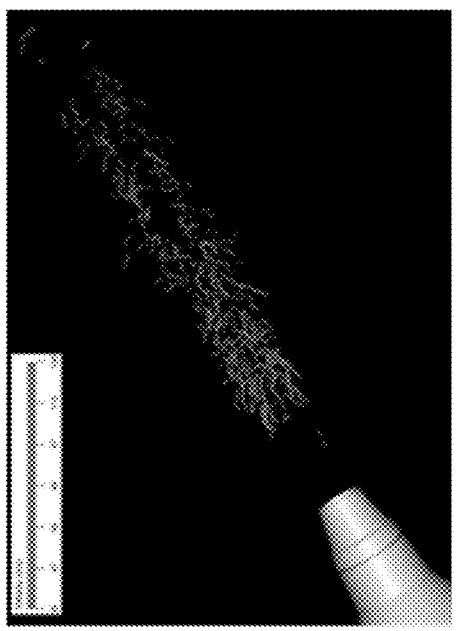
FIG. 17 shows an example of reconstructed centerlines colored by stretching.
Figure 18:
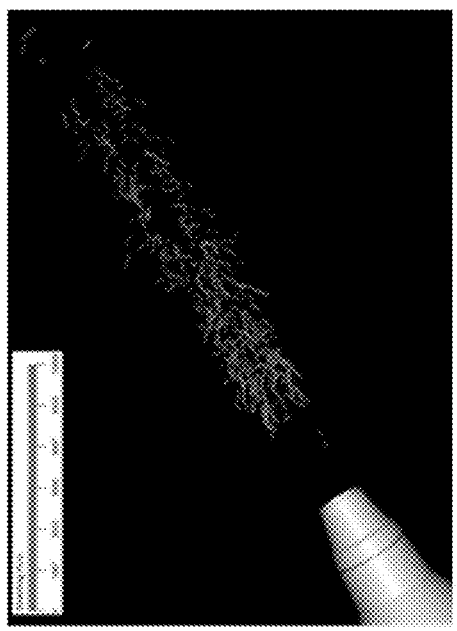
FIG. 18 shows an example graph of mean stretching per frame along the x-axis.
Figure 19:
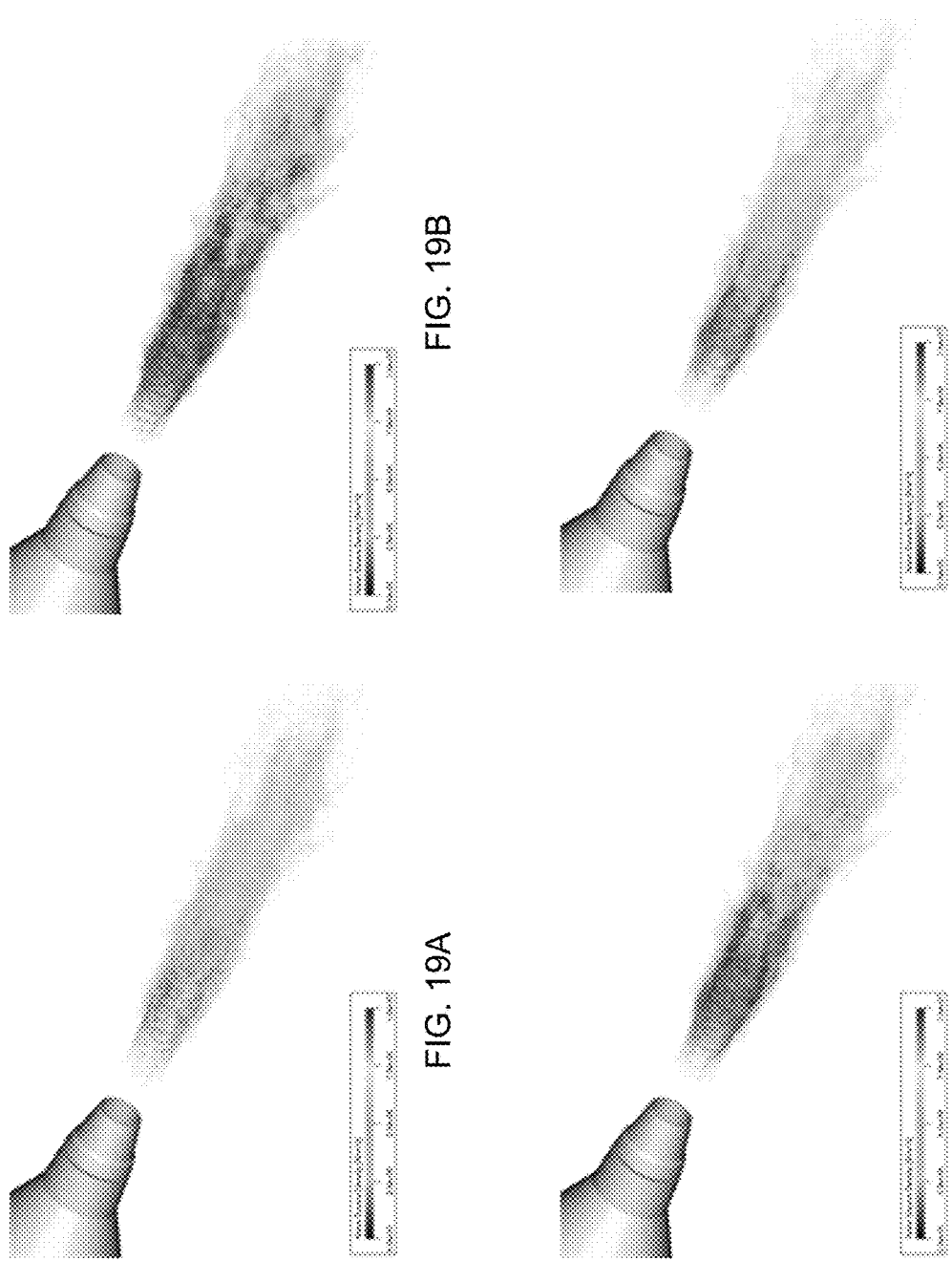
FIGS. 19A-19D show exemplary simulation results including a density of noise sources.

After the vortex tracking step, time variations of geometrical properties of the vortices are computed. For example, the convection velocity of vortices is computed, as shown in the snapshot image of FIG. 15. In FIG. 15, reconstructed centerlines colored by convection velocity from 30 to 130 m/s are shown. Here it can be seen that the convection velocity is almost zero in the outer layer of the jet shear layer and reaches a maximum close to the potential core boundaries. Distribution of the convection velocity along the streamwise direction is also computed. FIG. 16 shows an example graph of mean convection velocity along the x-axis. FIG. 16 shows an initial increase of the convection velocity, followed by a slow decrease moving downstream from the end of the potential core starting at ~0.3 m. For convection velocity, the 99% confidence interval is relatively small compared to the mean value, about 5%. The stretching of vortices is also computed based on the length change of the vortex centerlines from frame to frame. A snapshot of the stretching of individual vortices is presented in FIG. 17 (e.g., reconstructed centerlines colored by stretching from 0 to 10000%/s), and the distribution of stretching along the jet axis is presented in FIG. 18. The distribution of stretching shows a peak value of 3.5% per frame where the shear layer starts generating vortices in the outer boundary of the potential core. The stretching is then constant at about 0.7% per frame. It shows that vortices keep increasing in length as they move downstream in the jet; this is mostly due to 3 dimensional effects of the dissipation of the vortex cores.

Figure 20:
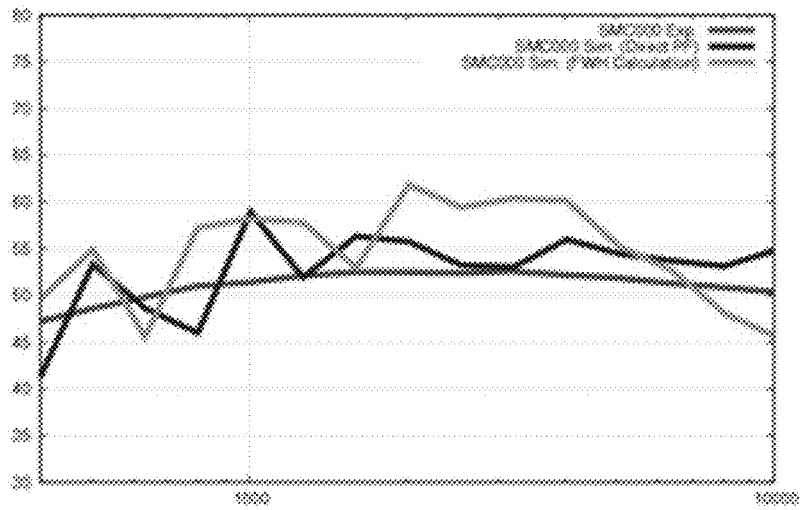
FIG. 20 shows exemplary simulation results.

Finally, the vortex system detection method provides information about pairs of vortices in co-rotation. At each time frame, the frequency of the sound emitted by a CRV is calculated from its rotation speed. To study the frequency-dependent CRV spatial distribution, which corresponds to the noise source distribution, the number of CRVs whose frequency is within a pre-determined 200 Hz band is calculated everywhere in the flow for frequency bands between 0 and 5 kHz. This number is normalized by the unit volume of the grid cell. The obtained scalar is the noise source density. The results are presented in FIG. 19A-D which shows a density of noise sources for the frequency band 200-400 Hz (a), 800-1000 Hz (b), 2000-2200 kHz (c) and 3000-3200 Hz (d). The maximum density is obtained in a cell for the 800-1000 Hz band range. It corresponds to the band where the maximum of far-field SPL is observed, as presented in FIG. 20 which shows simulation results for ⅓rd octave SPL at a probe located at 90° from the jet axis at x=0.2 m. The presence of vortex pairs is close to 0 for low frequencies (<200 Hz) and the high frequency bands vortex pairs count is lower than in the 800-1000 Hz range. Overall, the CRV noise sources are concentrated close to the potential core, where vertical eddies (thus turbulence) are generated in the shear layer.

FINSIM Application

Figure 21A:
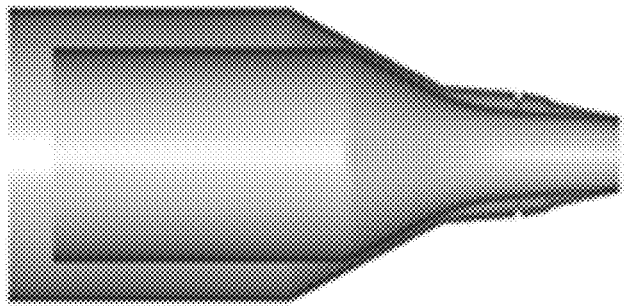
FIGS. 21A and 21B show two exemplary two jet nozzle designs.
Figure 21B:
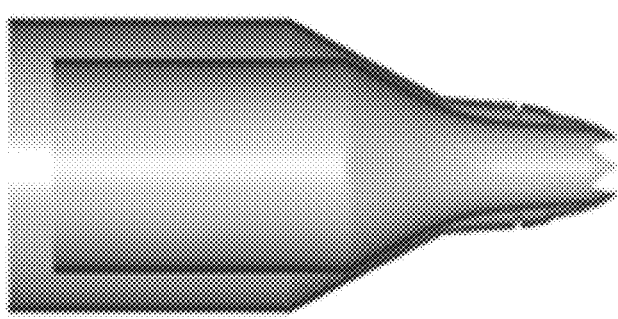

To illustrate the capabilities of the present approach to identify flow induced noise sources, it is applied to two different cases where a difference in noise generation has been observed. The first case is the comparison of two jet nozzle designs, SMC000 (round nozzle presented in the former section) and SMC006 (chevron type nozzle), for which the geometries are shown in FIGS. 21A and 21B, respectively. The second case is the comparison of two different side-mirror designs for a fully detailed production car which are known to generate different levels of radiated acoustics.

A. Jet nozzle geometry comparison: SMC000 vs SMC006

The SMC000 simulation and analysis using FINSIM were described in section IV. The SMC006 simulation was identical except for the change of nozzle geometry. FINSIM is applied to both cases, and the resulting spatial distributions of vortices, presented in FIGS. 22A and 22B, shows interesting differences. The SMC006 vortex distribution (FIG. 22A) is more localized because the chevrons tend to collapse the potential core. In the SMC000 case (FIG. 22B), the vortices are located all along the jet, downstream and around the potential core. However in the SMC006 case, the vortices are located mainly at the end of the potential core, which extends only about half the distance in the streamwise direction compared to SMC000. The potential core is also wider for SMC006, and vortices are distributed further in the radial direction compared to SMC000.

Further downstream, the turbulence, as indicated by the population of vortices, is rapidly dissipated for SMC006. Given the differences in vortex distribution, it can be expected that the SMC006 noise source locations are more localized, and possibly more intense at specific frequency bands.

Figure 23:
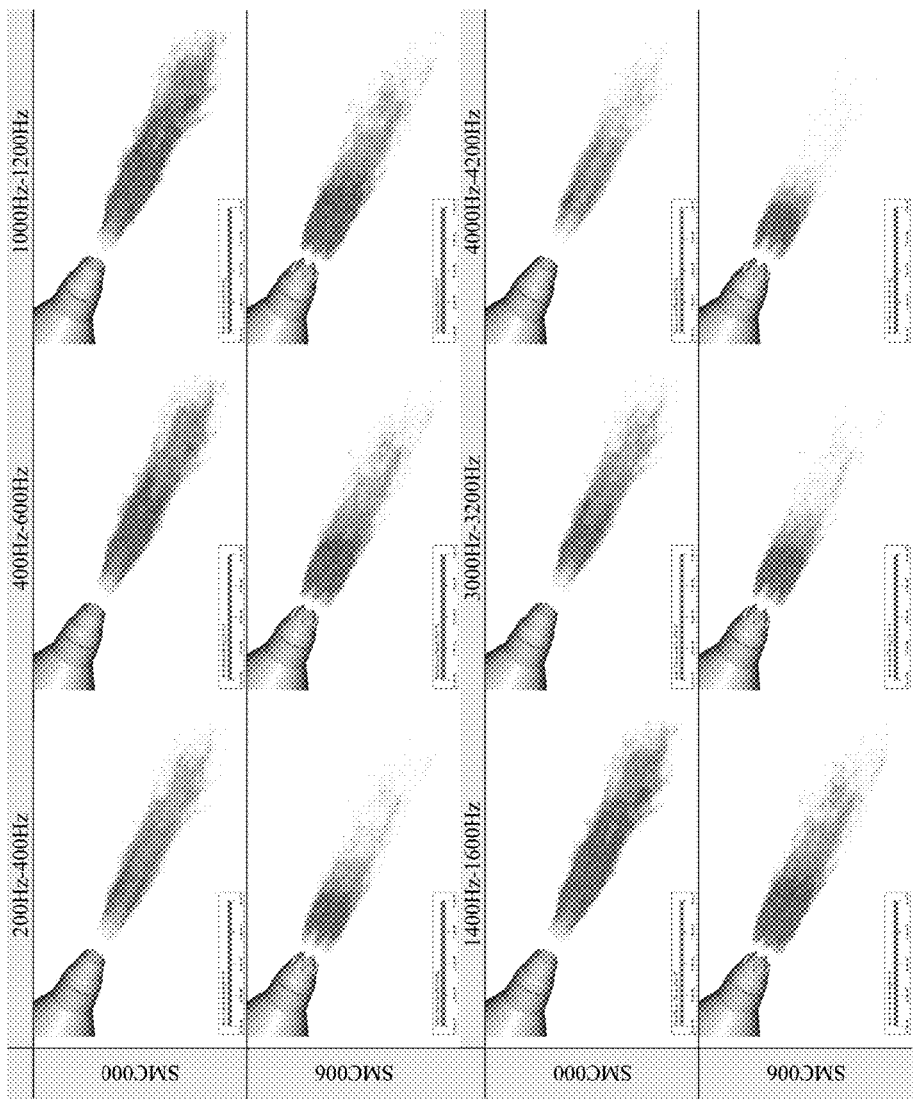
FIG. 23 shows a simulated distribution of the noise sources for the nozzle designs of FIGS. 21A and 21B at different bandwidths.
Figure 24:
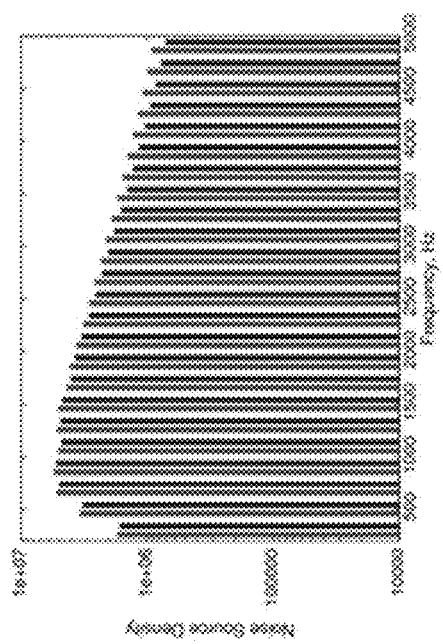
FIG. 24 shows a simulated total amount of noise sources detected for the nozzle designs of FIGS. 21A and 21B.

FIG. 23 shows simulated distribution of the noise sources for the nozzle designs of FIGS. 21A and 21B at different bandwidths. In FIG. 23, the distribution of noise sources (represented as before by the CRV density) is presented for SMC000 and SMC006. In order to compare the two designs, the distribution at each bandwidth is normalized by the maximum CRV density value considering both cases. These plots show that at low frequencies, the amount of CRV noise sources is larger for the SMC006 design, and localized close to the exit of the nozzle. The penetration of the nozzle chevrons in the jet triggers the turbulence, reduces the potential core length and creates the observed noise sources. Similar to the vortex distributions, the amount of CRV noise sources is relatively less for the SMC000 design and they are more evenly distributed along the plume. Up to 1200 Hz, the highest noise source concentrations belong to the SMC006 design. However, at higher frequencies, the trend is reversed and the the SMC000 has the higher noise source concentrations, but they are still evenly distributed in the plume whereas the SMC006 sources are still more localized even while decreasing in number with increasing frequency. In FIG. 24 the total number of noise sources is plotted vs frequency, and this clearly shows the difference in frequency distribution of the noise sources for these two nozzle designs, with SMC006 noise sources more concentrated at low frequencies and falling off at high frequencies compared to SMC000.

For now, a comparison of the resulting radiated acoustic power is not provided because it requires computation of intensity and power of the sources. Note that so far no depiction of the strength of the vortices has been shown. Until now the computation of the centerlines was not accurate enough to obtain such quantities. New development in the centerlines algorithm and rotation detection will overcome this issue and enable the strength of the CRV sources to be factored in and the radiated acoustic power to be predicted.

Figure 25B:
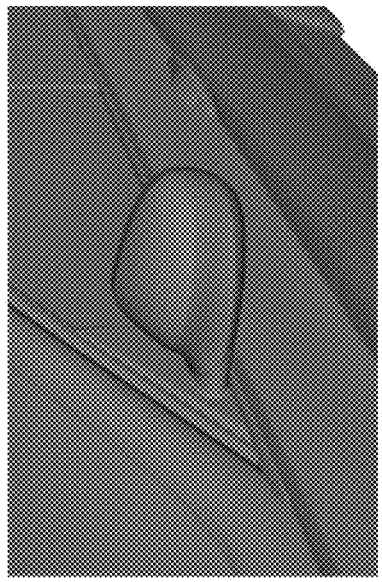
FIGS. 25A and 25B show two exemplary car mirror designs.
Figure 25A:
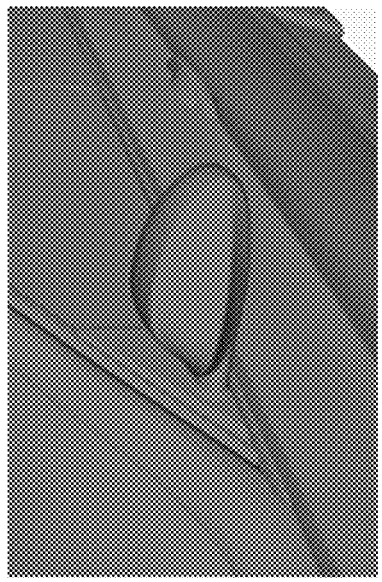
Figure 26:
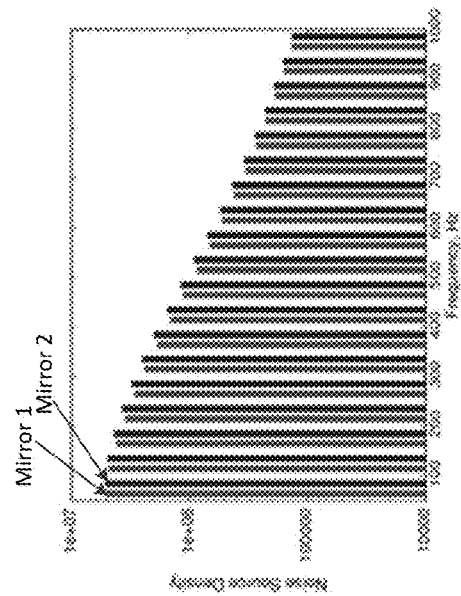
FIGS. 26-32 show simulation results for the mirror designs of FIGS. 25A and 25B.
Figure 27:
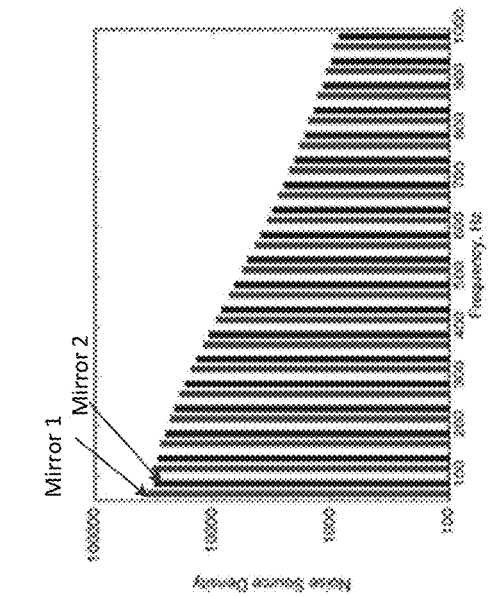
Figure 28:
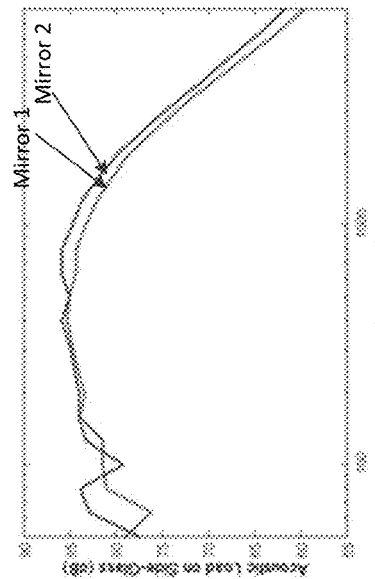
Figure 29:
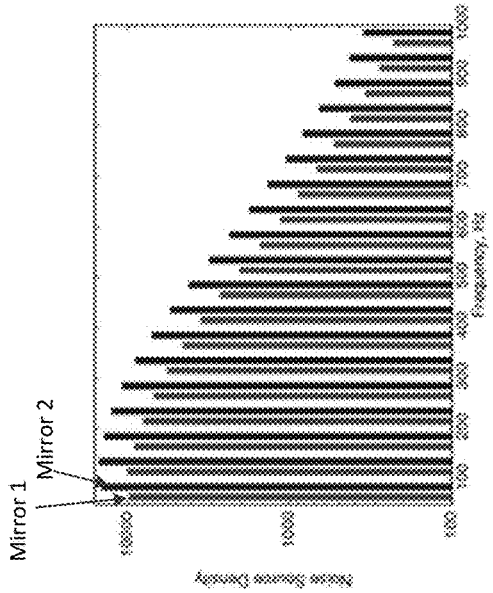

B. Automotive Side Mirror Design Comparison:

The present approach is now used to compare wind noise sources for two different side mirror designs on a fully detailed, real production car. The two investigated geometries are presented in FIGS. 25A (mirror 1) and 25B (mirror 2). Previous experimental and simulation investigations concluded that mirror 1 causes higher turbulent wall pressure fluctuation levels on the side glass, but mirror 2 generates higher acoustic levels on the side glass. Evidence for this supposition comes in part from the acoustic wall pressure loads on the side glass computed using the Ok method, as seen in FIG. 26, which shows higher levels for mirror 2 at all frequencies except at 100 Hz. For both mirror designs, FINSIM is applied to the PowerFLOW results and the total number of CRV noise sources over the simulation volume as a function of frequency over the simulated physical time is presented in FIGS. 27-29. At each frequency, the number of noise sources is higher for mirror 1. Assuming that the vortex sizes and strengths, and hence the CRV strengths and resulting acoustic power per CRV, are comparable for the two cases, then the total number of noise sources will correspond well to the overall acoustic power, hence the trend predicted here by FINSIM provides the expected result that mirror 2 causes higher acoustic levels, and the results.

Figure 30:
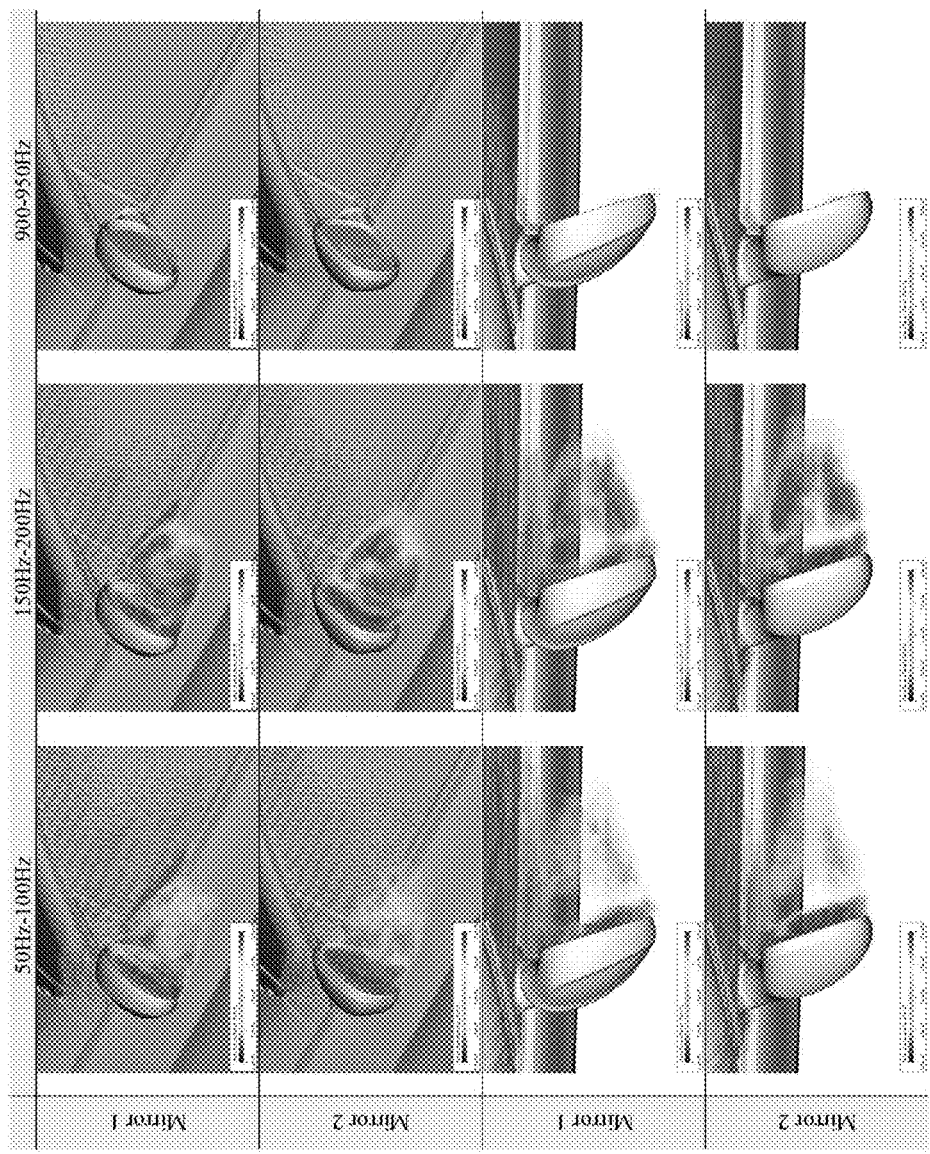
Figure 31:
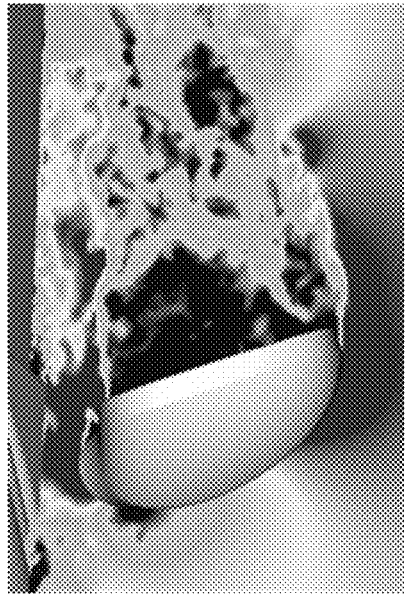
Figure 32:
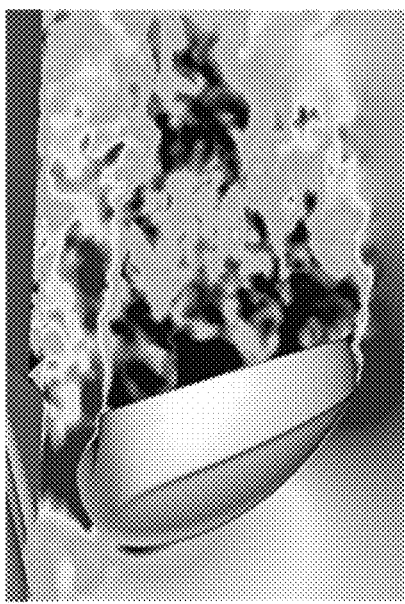

The distribution of noise sources is computed in the same way as for the jet example and presented in FIG. 30. In the zoomed out viewpoint, the overall noise source distribution is seen to be very similar between the two designs. At high frequency, more noise sources are present near the A-pillar in both designs, which agrees well with the known behavior of the A-pillar vortex. In the zoomed in viewpoint, the primary locations of the additional noise sources for mirror 2 are seen to be near the perimeter of the rear face of the mirror housing. In FIGS. 31 and 32, the velocity magnitude in the vicinity of the side mirrors on a horizontal plane shows a stronger recirculation downstream of mirror 2 compared to mirror 1. The area downstream the tip of mirror 2, corresponding to high velocity magnitude, extends on a larger distance compare to mirror 1. As the flow is detached earlier for mirror 1, it is consequently slower at the tip of the mirror where the recirculation happens. Since the kinetic energy is less, the resulting acoustic energy is also less as a higher kinetic energy induces stronger turbulent structures at the tip of the mirror, which are noisier. A stronger turbulent shear layer correlates with a higher density of energetic vortex pair interactions, leading to a higher density of noise producing CRV systems, and hence stronger noise generation as observed in FIG. 26 for mirror 2.

Figure 33A:
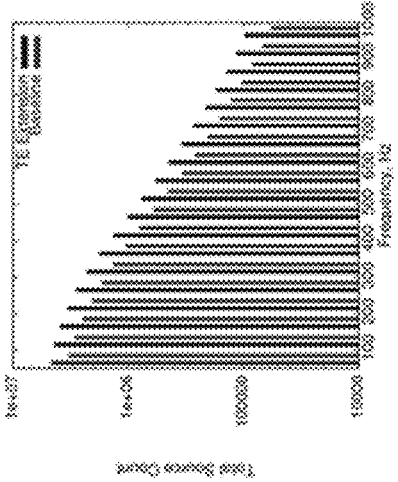
FIGS. 33A and 33B show an exemplary baseline mirror and a Trailing Edge (TE) Extension mirror.
Figure 33B:
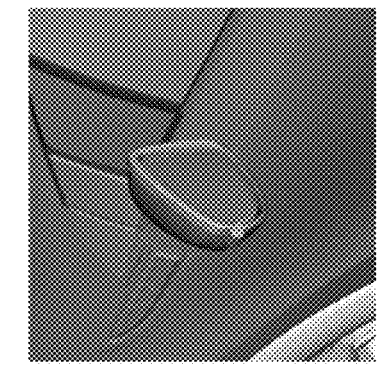
Figure 34:
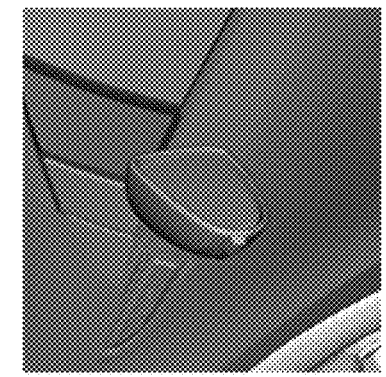
FIGS. 34-36 show simulation results for the mirror designs of FIGS. 33A and 33B.
Figure 35B:
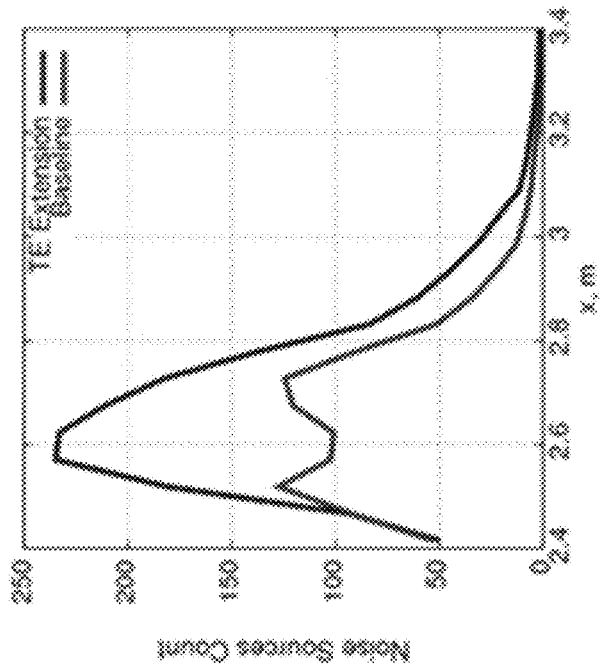
Figure 35A:
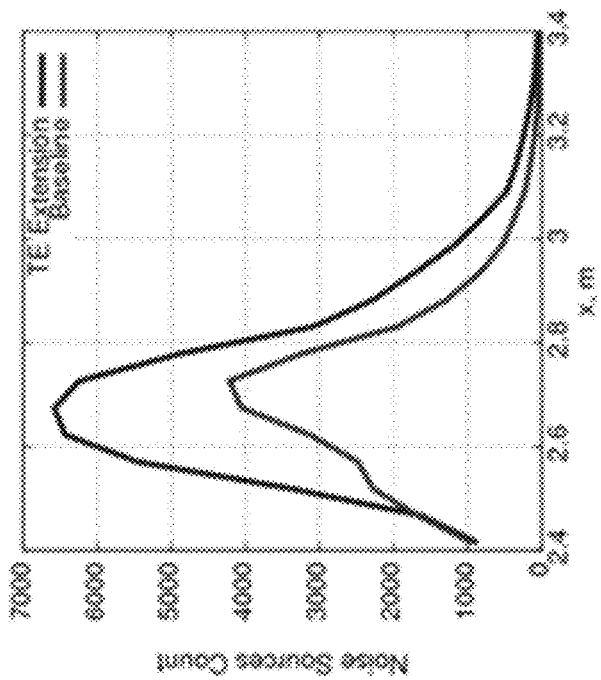

C. Additional Automotive Side Mirror Design Comparison:

The following case illustrates the ability of FINSIM to pinpoint noise production discrepancies between two similar designs. The baseline mirror corresponds to a real car geometry and the Trailing Edge Extension (TEE) mirror is constructed from the baseline mirror by adding a step to the baseline (grey volume on FIG. 33A-B). Since the mirror geometries are very similar, the leading edge flow is expected to be unchanged by the geometry modification. Experiment shows that the levels of interior noise of the car are higher for the TEE mirror. Since the flow is unchanged on the window, the difference is due to the acoustic contribution of the flow, possibly generated in the mirror wake. Here the FINSIM analysis is performed in the wake of the mirror. A difference in the total number of CRVs is observed in FIG. 34. The difference is constant over the whole range of frequency at about 25% (~2 dB). FINSIM has detected a difference in the generation of the acoustics. This difference is also observed in FIG. 35A-B where the distribution of noise sources along x is higher at both frequency ranges for the TEE design, especially right downstream the leading edge.

Figure 36:
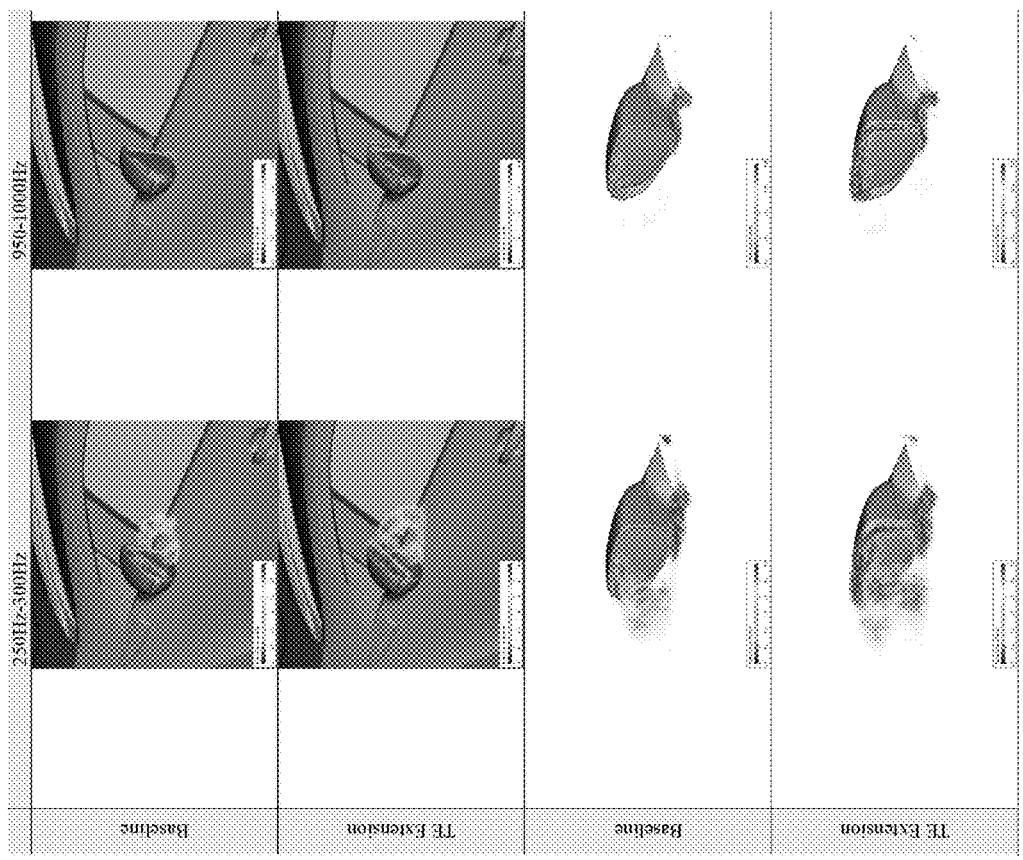

In conclusion, the TEE design produces more noise due to the step added to the baseline geometry. This is illustrated in FIG. 36 as the noise source density is the highest for the TEEE design close to this additional volume. However, the noise source density levels are lower for the baseline design.

Figure 37A:
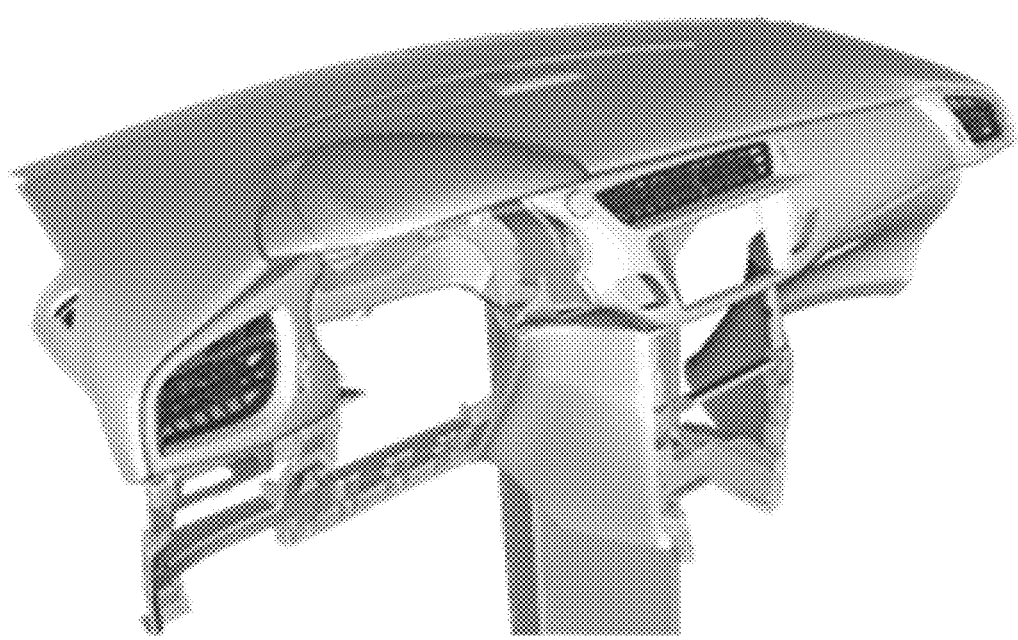
FIGS. 37A and 37B show an exemplary geometry of HVAC system with ducts, vents and dashboard.
Figure 37B:
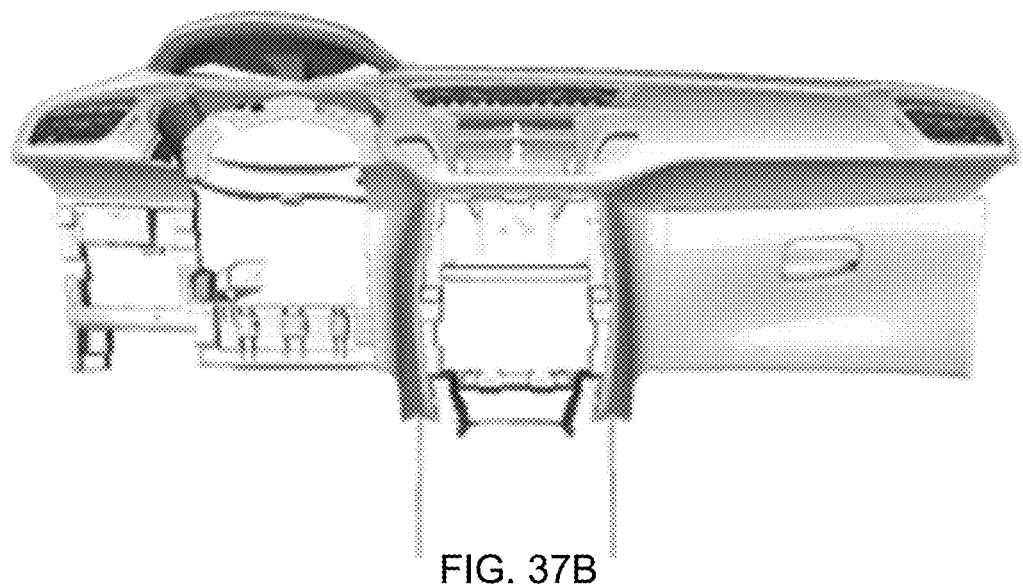

D. HVAC Ducts Design Comparison:

The following case illustrates the application of FINSIM to a HVAC unit system in order to pinpoint the location of noise sources (aka CRVs). A real duct+vents geometry (FIG. 37A-B) as well as a new design derived from this baseline are compared using FINSIM. The new design is obtained by modification of the ducts geometry in order to reduce fluctuations in turbulent areas. A noticeable difference in SPL levels is observed and consequently a reduced interior noise. The modifications are presented on FIGS. 38A-B and 39A-B.

Figure 40:
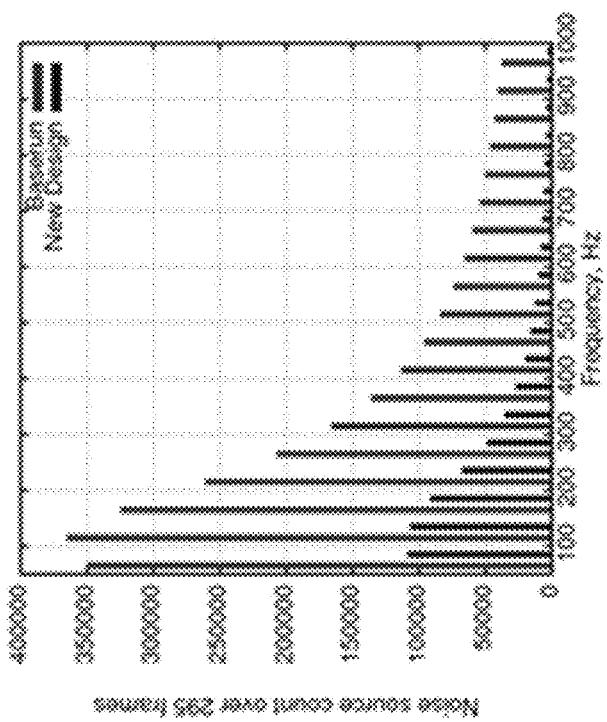
FIGS. 40-42B show simulation results.
Figure 41A:
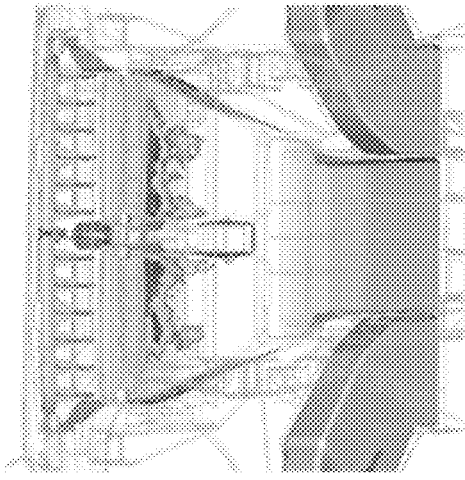
Figure 41B:
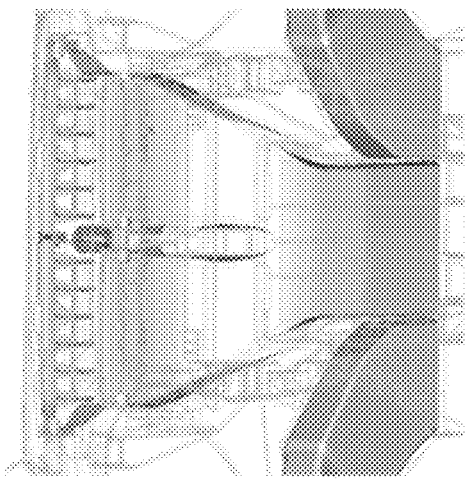
Figure 42A:
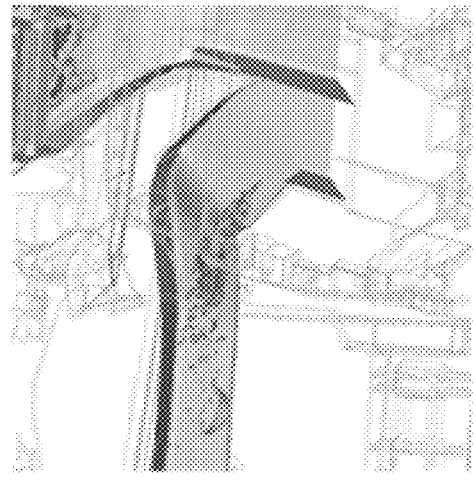
Figure 42B:
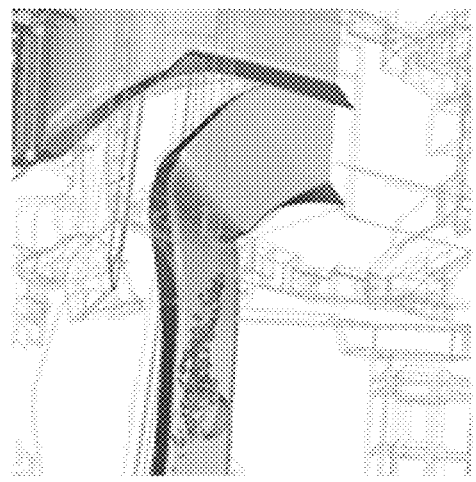

FINSIM successfully captures the difference in noise sources location and quantity as illustrated in FIG. 40. The total number of CRVs is different from the new design at all frequencies by a factor of 3 to 4. The new design is quieter than the baseline. In addition the CRV density maps shown in FIG. 41A-B and FIG. 42A-B illustrate the efficiency of the geometry modification in the reduction of noise. FINSIM is pinpointing the location of the sources for the baseline, but is also able to rank them by importance for future design improvement prioritization. The area close to the vent shown is the area mostly responsible for the higher number of CRVs in the ducts.

By tracking the motion of vortices and co-rotating vortex pairs, the Flow-Induced Noise Source Identification Method (FINSIM) makes an explicit link between vortex dynamics and the resulting quadrupole-like noise radiation. By analyzing the temporal and spatial evolution of vortex pairs, the location, frequency, directionality and intensity of these noise sources are recovered. Simulation and analysis of the canonical 2D isolated co-rotating vortices (CRV) problem and a forced 2D shear layer flow case verify the viability of the basic concept. The noise sources are shown to be correctly located and the time evolution of their strength provides a reasonable prediction of the flow-induced noise production. The shear layer flow results also show the ability to capture the convection of the noise sources by the mean flow. Extension of the method to three dimensional flows is applied first to a turbulent jet configuration. The 3D vortex detection and tracking method is seen to enable CRV identification and to give reasonable results for the statistical distribution of vortex density and noise sources (represented for now by the CRV density). The application of FINSIM for design comparison is demonstrated for the jet with two different nozzle geometries, and for a car with two different side mirrors. In both studies, the expected overall noise source trends are correctly captured. In the side mirror comparison, FINSIM successfully provides the specific locations of the dominant aeroacoustic sources, allowing a clearer understanding for why one mirror is acoustically better than the other.

In some implementations, noise sources can be identified and grouped together using a clustering process. As discussed above noise sources can be either a set of finite points with a given x, y and z coordinates within a space and a given acoustic "strength" or a continuous/discrete variable representing the noise generation at a given location (x, y, z). The variable can be reduced to a set of finite points if the x, y, z domain of a space is discretized and associated strength is variable (x, y, z). Given or without a "strength" threshold, the set of finite points representing acoustic noise sources can be reduced. Given the finite set of points, the noise-generating regions can be identified as regions with high density of noise sources, meaning for each source in such region, there is another source within this region within a predetermined distance. This way noise generating clusters can be identified. The characteristics for noise sources in each cluster can be combined (for example, averaged, summed, and/or volume-integrated) to generate aggregate quantities for the cluster.

Figure 43:
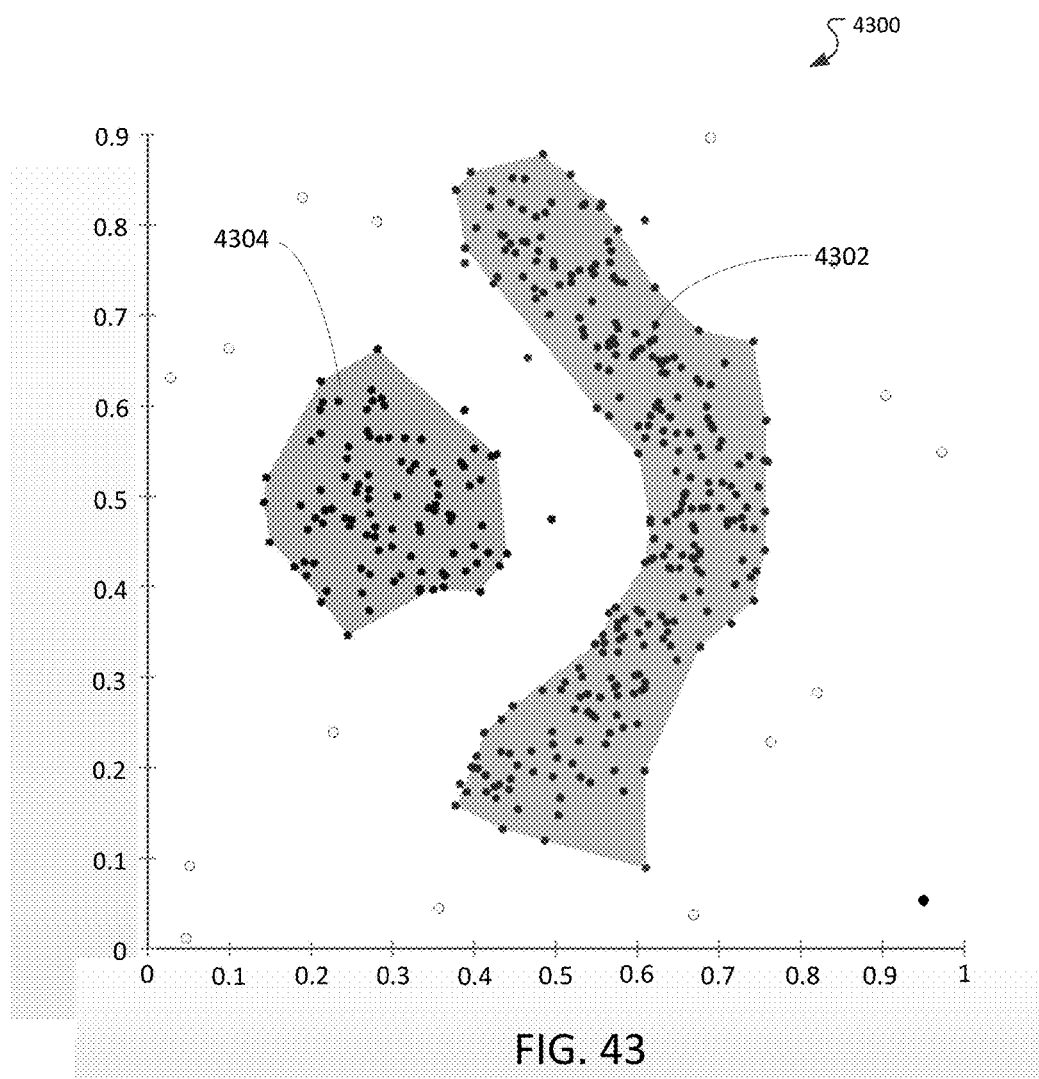
FIG. 43 is a graph illustrating clustering.

FIG. 43 is a graph 4300 illustrating clustering. The dots on the graph 4300 represent acoustic power sources of different acoustic strengths. Each acoustic power source has a spatial position that can be represented, for example, by x, y and z coordinates of a Cartesian coordinate system. The acoustic power sources can be grouped together to form clustered sources 4302 and 4304. The grouping of the acoustic power sources can be dependent on the strength and density distribution of the acoustic power sources. For example, a threshold strength can be predefined, and the acoustic power sources with strengths that exceed the predefined threshold can be grouped together in one or more clusters. The predefined threshold strength can be changed to include or exclude one or more acoustic power sources in the clustering process.

The acoustic power sources can be grouped together using various clustering techniques, for example, algorithms based on multi-objective optimization. The algorithm can be an iterative process where the parameters associated with optimization are modified until desired results are achieved. Some clustering techniques that can be utilize include, but are not limited to, connectivity-based clustering, centroid-based clustering, distribution-based clustering, and density-based clustering. In one implementation, the acoustic power sources can be grouped together based on a threshold distance L that determines the proximity of the acoustic power sources in a clustered source (e.g., 4302, 4304 etc.). The threshold distance L can be predefined before the clustering process and/or dynamically calculated by comparing the position of various acoustic noise sources. A reference acoustic noise source can be identified and all the noise sources that lie with the distance L from the reference acoustic source are grouped into a clustered source.

The technique for noise source identification can be applied to determine and describe the flow of air through the HVAC system of an automobile. For example, once the air flow is determined, areas of turbulent flow of air can be identified. Based on the turbulent flow of air, the location and strength of acoustic power sources can be identified.

Figure 44:
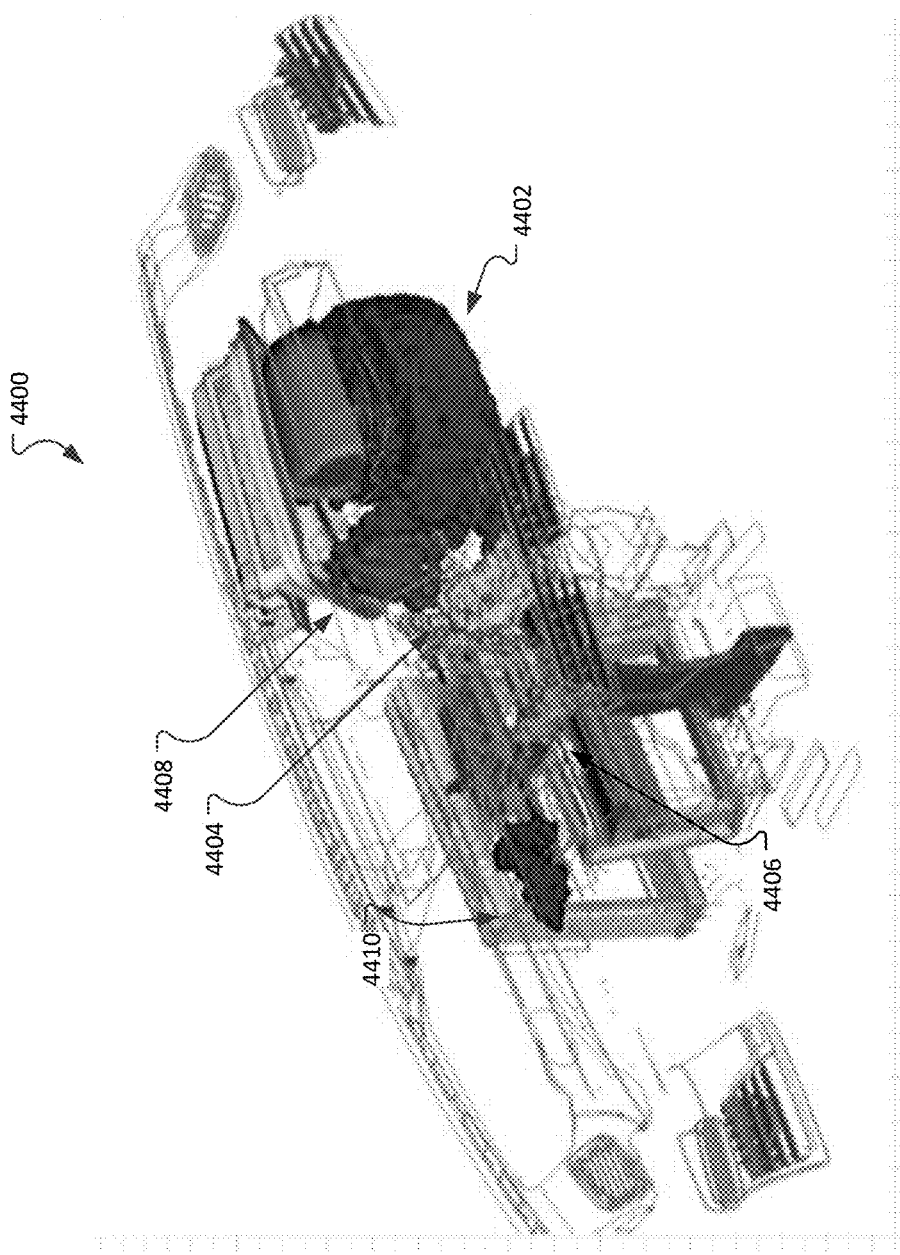
FIG. 44 illustrates an example of clustering of the identified acoustic noise sources in an HVAC system.

FIG. 44 illustrates an example of clustering the identified acoustic noise sources in an HVAC system 4400. Noise sources are clustered with other similarly located noise sources. For example, noise cluster 4402 is located on the lower right blower. Noise cluster 4408 is located to the left of and behind noise source 4402. Noise cluster 4404 is located to the left of noise cluster 4402. Noise cluster 4406 is located to the left of noise cluster 4404. Noise cluster 4410 is located to the left of and above noise cluster 4406. The clustering process groups high acoustic power measurement volume cells spatially close to each other, and consequently identifies regions of space where strong noise sources are particularly present. This clustering simplifies the acoustic analysis and improves the performance of the computer system performing the simulation and analysis by reducing processing of multiple individual acoustic noise sources to processing a single cluster.

Figure 45:
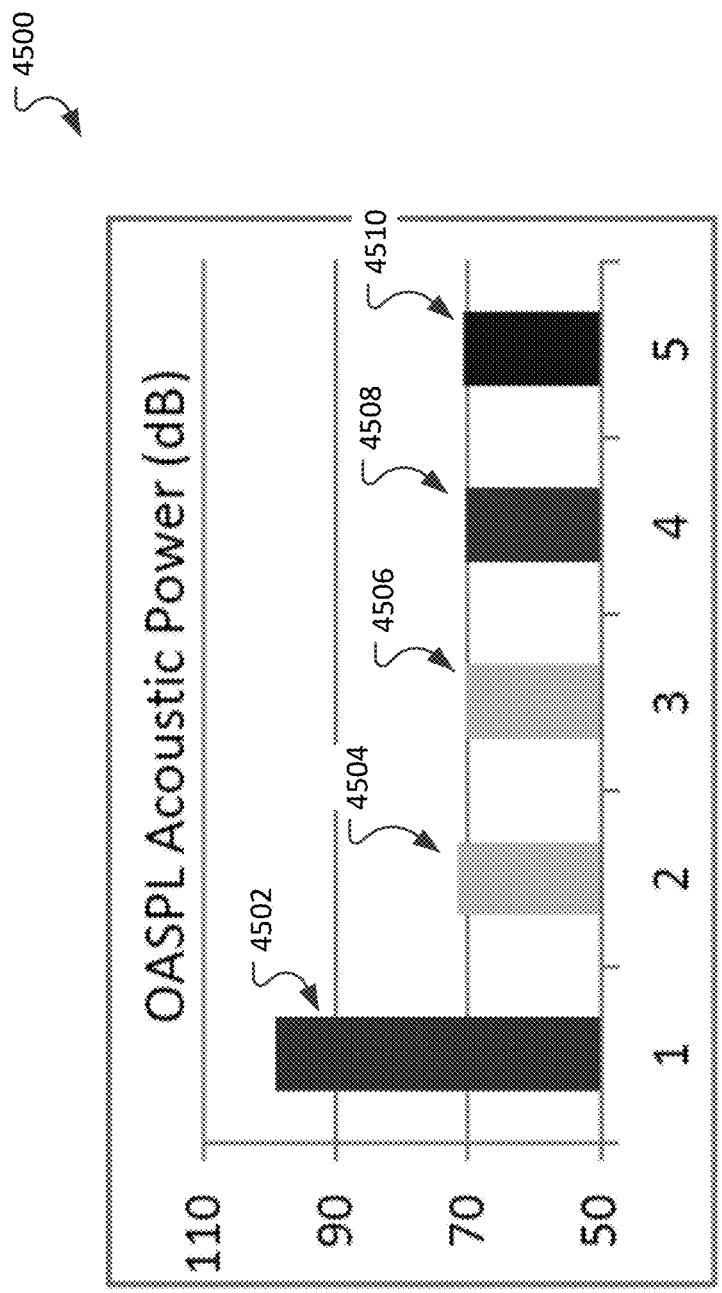
FIG. 45 is a chart illustrating a ranking of noise clusters based on their acoustic power.

By the evaluation of the overall acoustic power radiated per cluster, for the integrated levels and/or for the spectral characteristic, a ranking can be introduced. For example, FIG. 45 is a chart 4500 illustrating a ranking of noise clusters. Bar 4502 corresponds to the noise generated by noise cluster 4402 of FIG. 44. Bar 4504 corresponds to the noise generated by noise cluster 4404 of FIG. 44. Bar 4506 corresponds to the noise generated by noise cluster 4406 of FIG. 44. Bar 4508 corresponds to the noise generated by noise cluster 4408 of FIG. 44. Bar 4510 corresponds to the noise generated by noise cluster 4410 of FIG. 44. A system may highlight areas that contribute most to the ambient noise, for example noise cluster 4402.

In some implementations, noise may be determined and clustered under a variety of different circumstances according to the operating conditions of the system. For example, the noise from an HVAC may be determined separately under high blower rotation speed and low blower rotation speed conditions. Clusters from both operation points may be analyzed together and separately (either sequentially or in parallel).

Figures 46A, 46B:
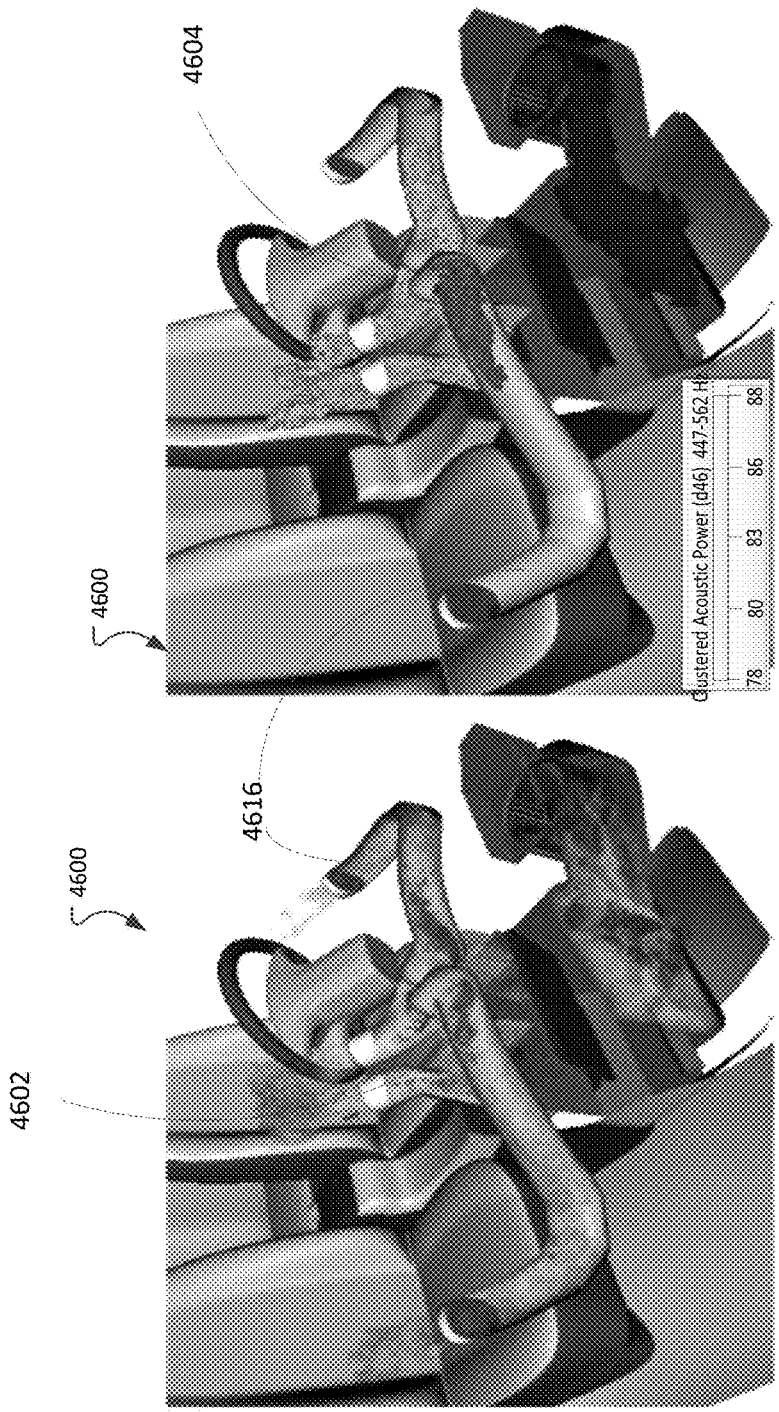
FIG. 46A illustrates an HVAC system where the noise sources are identified but not clustered.
FIG. 46B illustrates the HVAC system where the noise sources are identified and clustered.

FIG. 46A illustrates an HVAC system 4616 where the noise sources are identified but not clustered. A generic HVAC system 4616 is modeled together with an idealized cabin interior 4600. In the current stage no acoustic properties of the cabin have been considered other than the geometry of the cavity. FIG. 46B illustrates the HVAC system 4616 where the noise sources are identified and clustered (for example, into cluster 4604).

In some implementations, not all acoustic noise sources and noise cluster have an equal impact or importance. For example, noises that no one hears, or that a target audience does not hear, may be less relevant to design decisions. Noise pollution is the disturbing or excessive noise that may harm the activity or balance of human or animal life. Unwanted noise can damage psychological health. Noise can cause hypertension, high stress levels, tinnitus, hearing loss, sleep disturbances, and other harmful effects. Accordingly, it is unsurprising that silence or the reduction of noise is a desirable quality associated with luxury and quality. One example of an industry that has embraced noise reduction as a sign of quality is the automobile industry. Many luxury automobiles advertise the relative silence of their cabins.

As discussed above, the noise in the cabin of an automobile can originate from various sources, for example, the engine of the automobile, the motion of the tires over the road, the flow of air from the heating ventilation air conditioning (HVAC) system of the car etc. Noise in the cabin from external noise sources, engine and tires can be reduced by sound proofing the cabin of the automobile, for example, by applying sound dampening/deadening materials. Noise caused by airflows from within the cabin, (for example, noise caused by turbulent flow of air through an HVAC system), on the other hand, can only be reduced by changing the design of the interior of the automobile.

For each noise-generating region, the strength (acoustic power) injected in the system can be determined as describe above. However, the actual contribution of each of these regions to a given location (such as driver's ears) is not yet accounted for, as the strength is what is injected to the system, regardless of the acoustic properties of the system (absorption, diffraction, etc.).

Using a numerical analysis to calculate an acoustic transfer function between each region or noise source and the location, a system can correct the strength of each region or noise source to directly obtain the contribution of each noise-generating region or source to the location and to directly obtain the sound power level contribution of each measurement cell to the desired location for each frequency Such method allows for the unique ranking of noise-generating regions of a system based on a receiver location and allows for efficient choice of which areas of the design to work on first to make the largest impact.

Figure 47:
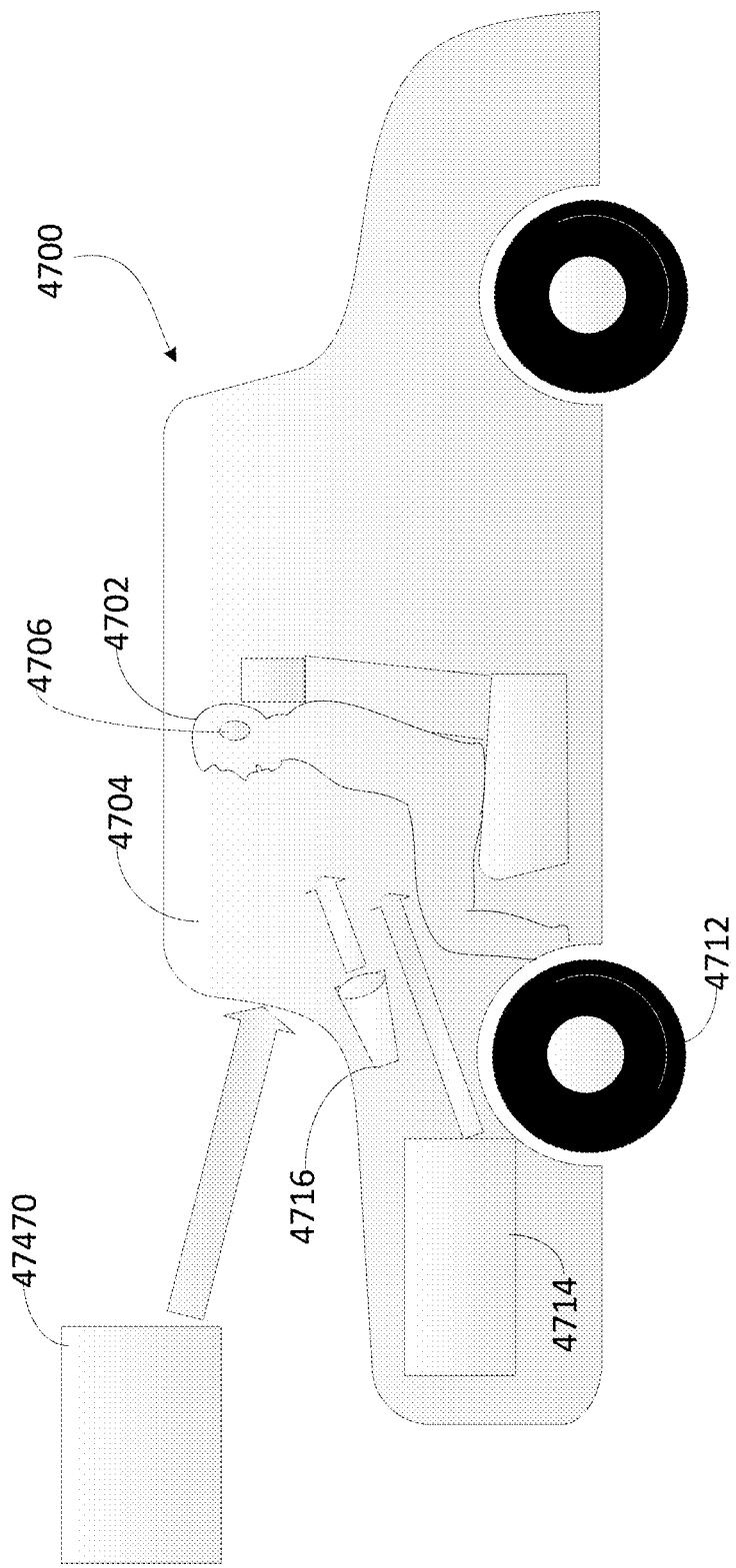
FIG. 47 illustrates an occupant in the cabin of an automobile.

FIG. 47 illustrates an occupant 4702 in the cabin 4704 of an automobile 4700. The occupant 4702 can hear noise from various sources, for example, external noise sources 47470, tires 4712, engine 4714 and HVAC system 4716. As described before, the noise from external noise sources 47470, tires 4712, and engine 4714 can be reduced by sound proofing the cabin of the automobile. Noise from the HVAC system, which reaches the ear 4706 of the occupant 4702, can be reduced (e.g., minimized) by improving the design of the HVAC system. In order to determine how to improve the HVAC system (or any other noise source associated with the flow of air or another fluid in a system), an analysis of the flow-induced noise sources present in the HVAC system can be performed. While the example below is described in relation to an automobile HVAC system, the system described herein can be applied to any fluid flow-induced noise source, including but not limited the air flow around the vehicle (wind noise), the air flow through the combustion engine (air intake, exhaust systems), the air flow around cooling fans, vehicles (such as airplanes, boats, and trains), movie theaters, home theaters, homes, offices, etc.

In some implementations, the strength of acoustic noise sources and/or noise clusters can be adjusted based on the amount of noise that is heard by a particular location or locations. The acoustic power of the individual noise sources and the noise cluster can be adjusted based on a sensor point located at the driver's ears position. For example, a microphone is strategically placed and pressure signals are recorded at that point. The acoustic power can be adjusted based on a transfer function from a noise source or a noise cluster to the sensor point. In general, a transfer function is the relationship between a strength of a source (e.g., the acoustic power at the noise source or the noise cluster), and the strength at some remote point known as the receiver (e.g., the ear of the driver). The acoustic transfer functions between the respective acoustic sources or clusters and the target position, for example a drivers left ear, can be dependent on the geometric boundary condition as well as the presence of sound absorbing materials along the transfer path.

Figure 48A:
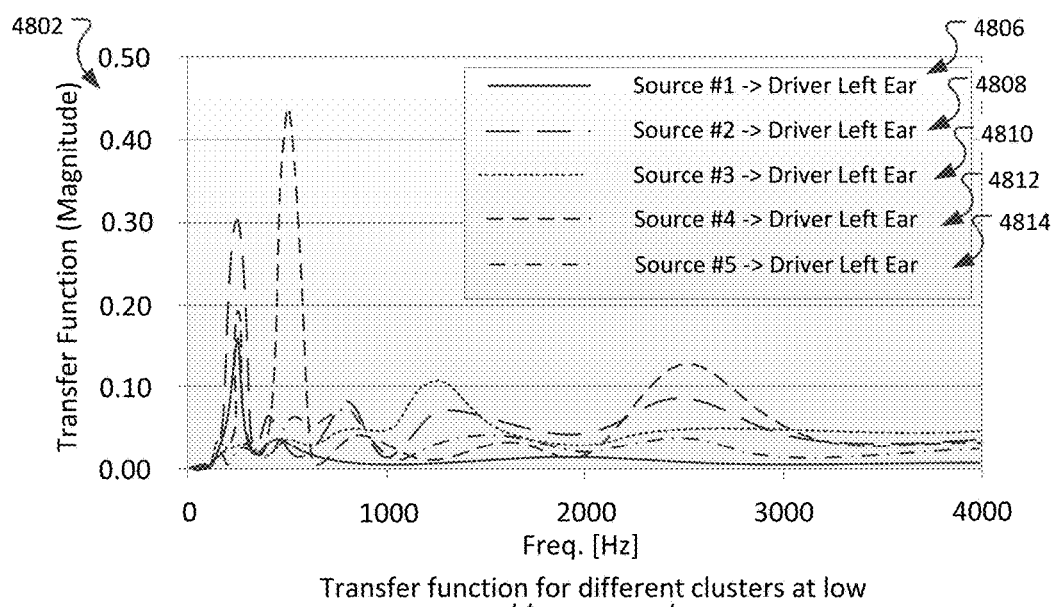
FIGS. 48A and 48B illustrate an example of calculated transfer functions from noise sources to a driver's left ear under low and high speed blowing conditions, respectively.
Figure 48B:
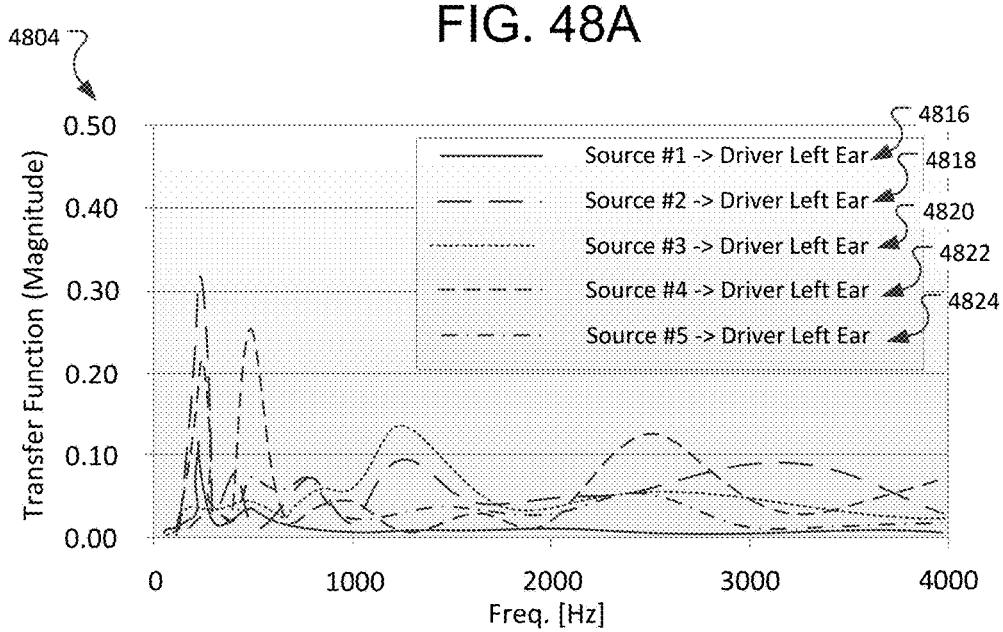

FIGS. 48A and 48B illustrate an example of calculated transfer functions for noise sources to a driver's left ear under low and high speed blowing conditions, respectively. It shows that the transfer functions differ significantly. The calculated transfer function under low blower speed 4802 is visibly different than the calculated transfer functions at high blower speed. In these figures, each line represents a determined transfer function for the different noise sources in a vehicle. For example, source #1 4806 and 4816 are a calculated transfer function for cluster 4402 of FIG. 44, source #2 4808 and 4818 are a calculated transfer function for the cluster 4404 of FIG. 44, source #3 4810 and 4820 are a calculated transfer function for the cluster 4406 of FIG. 44, source #4 4812 and 4822 are a calculated transfer function for the cluster 4408 of FIG. 44, and source #5 4814 and 4824 are a calculated transfer function for the cluster 4410 of FIG. 44.

Transfer functions are usually defined as the ratio of two quantities. In acoustics, the transfer function can be defined as the ratio of two acoustic pressures (pressure at receiver over pressure at source), or more commonly, as the ratio of acoustic pressure at the receiver over volume flow rate at the source. The data obtained with an acoustic simulation of the system (calculated with an acoustic Finite Element Method (FEM) solver, or a LBM solver, or other acoustic solver) can be used to calculate the acoustic transfer function between each noise source, or a combined plurality of sources. Acoustic transfer functions can also be measured in experiment with a volumetric source and a microphone to record pressure at each location of the system.

In LBM, the acoustic transfer function between a noise source and a receiver can be calculated for each noise source, but it can require one simulation per noise source (imposed volume flow fluctuations at each noise source). Using the property that the acoustic transfer function from a first point to a second point is equal to the transfer function from the second point to the first point, the transfer function can be calculated in a single simulation, with the receiver set as the source (imposed volume fluctuation boundary condition) and the sources set as receivers (pressure measured at each noise source). This process accelerates the calculation of acoustic transfer function from as many simulation as noise sources to one simulation.

Figure 49A:
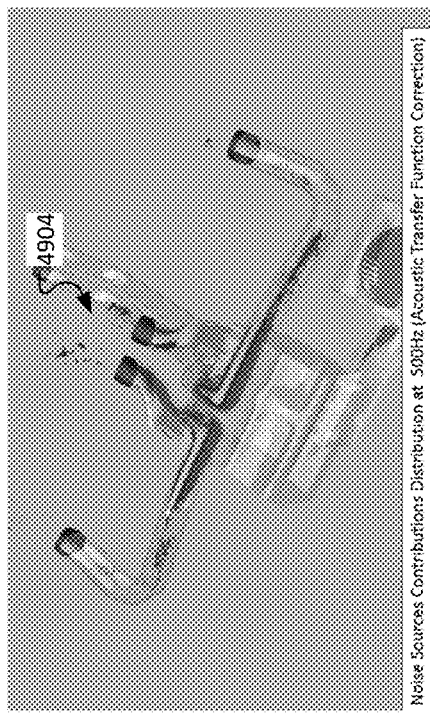
FIGS. 49A-D illustrate examples of noise sources of an HVAC system and noise source contributions of the HVAC system to a driver.
Figure 49B:
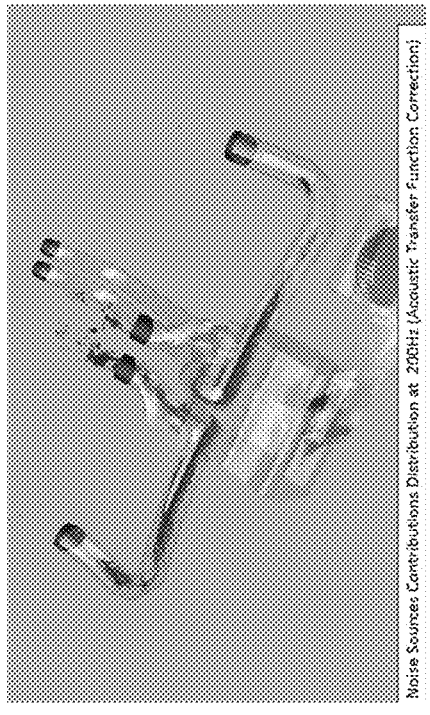

FIGS. 49A-D illustrate examples of noise sources of an HVAC system and noise source contributions of the HVAC system to a driver. FIG. 49A illustrate noise sources at 500 Hz. In this example, each black dot represents a noise source. FIG. 49B illustrates an example, of the contributions of each noise source at 500 Hz to the ear of a driver. As illustrated by the two figures, some noise sources do not make a material contribution. For example, the air from the blower 4902 makes a much smaller contribution 4904 than would be otherwise expected, and not all noise sources make a material contribution to the noise heard by a driver.

Figure 49C:
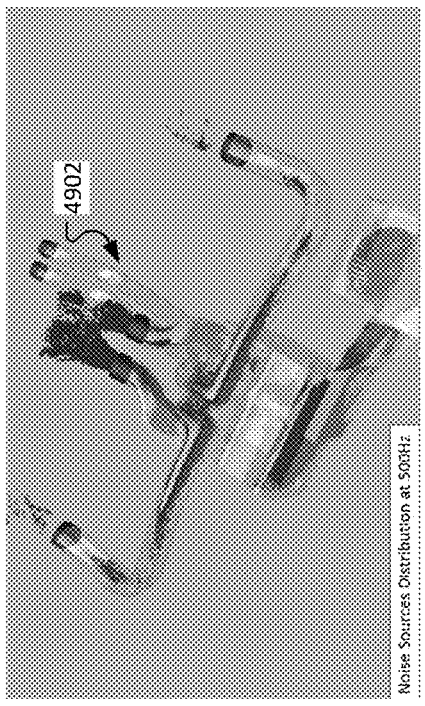
Figure 49D:
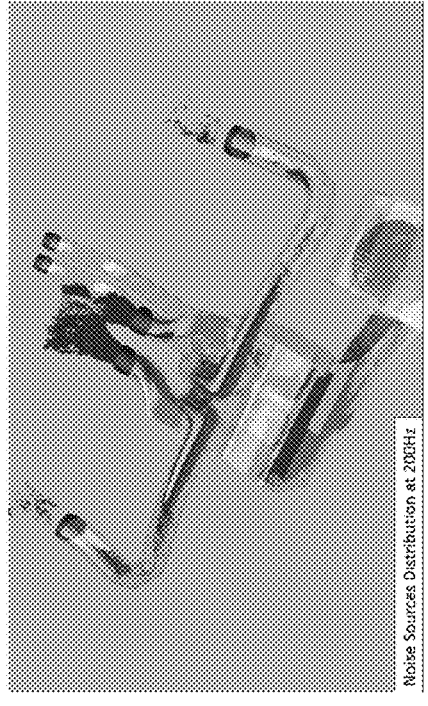

FIGS. 49C and 49D represent the noise sources at 200 Hz and the noise source contribution at 200 Hz to a driver respectively.

In some implementations, the noise source contributions can be used as an objective function in an optimization project. For example, the goal of the optimization project may be to minimize the noise source contribution.

Figure 50A:
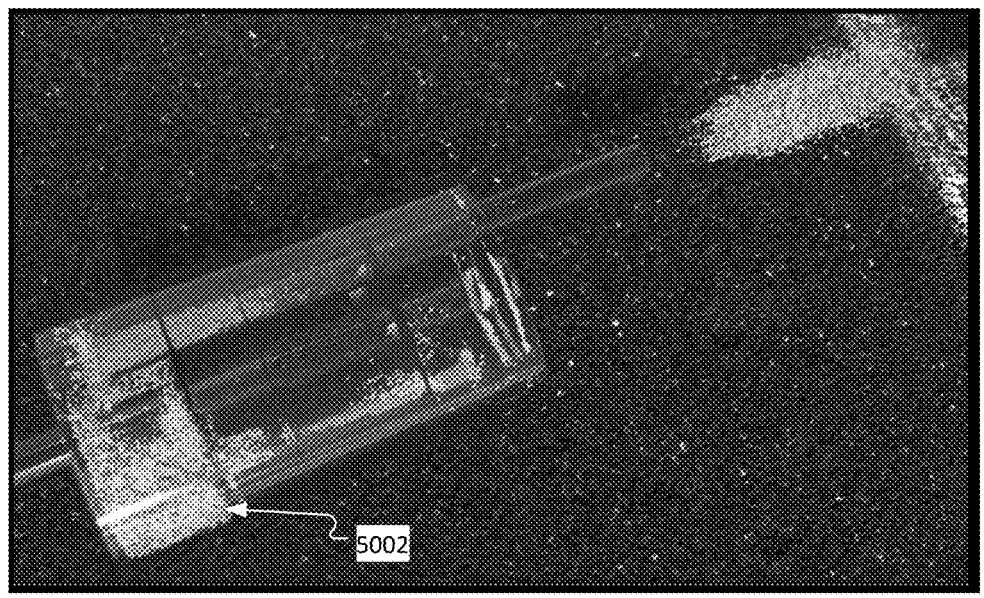
FIGS. 50A-B illustrates noise sources and noise source contribution to an external observer, respectively.
Figure 50B:
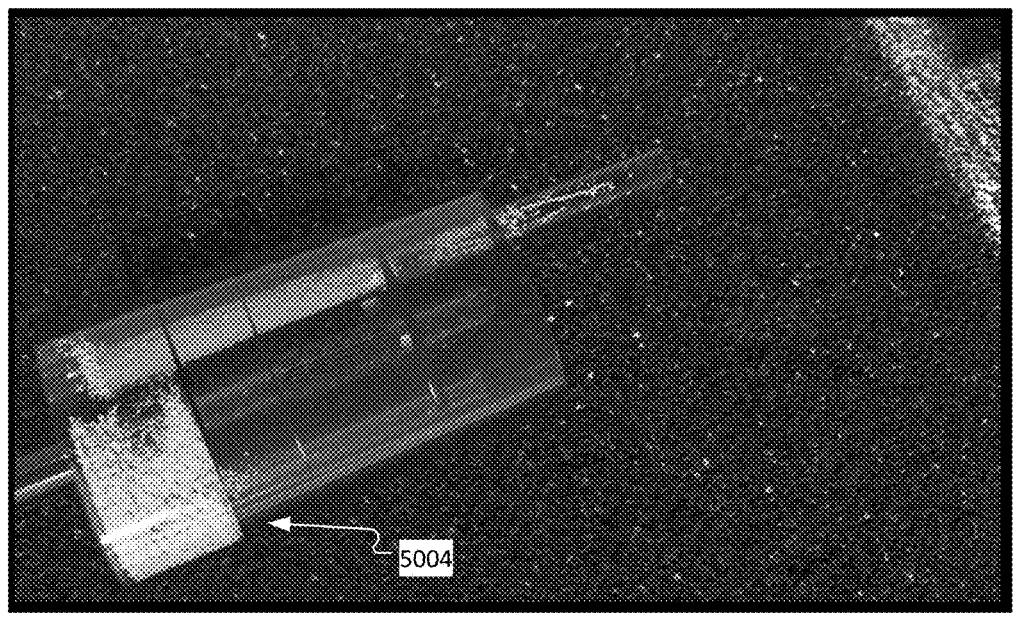

FIGS. 50A-B illustrates noise sources and noise source contribution to an external observer, respectively. In FIG. 50A, the noise sources 5002 are represented by white dots. In FIG. 50B, the noise source contribution is represented by white dots 5004.

In some implementations, acoustic pressure can be measured for the left ear and the right ear independently. Similarly, pressure may be measured for multiple different locations (for example, for passengers in a vehicle, audience members at a theater, etc.).

In some implementations, a transfer function may be applied to each acoustic power source prior to clustering the acoustic power sources into noise clusters. In some implementations, the transfer function may be applied to each noise cluster. Each method can provide different performance improvements to a computer system processing the data. By adjusting the acoustic power of each source prior to clustering, and comparing the adjusted power of each source to a threshold (as described above) fewer noise sources need to be considered when clustering, as some of the noise sources may fall out of consideration as being beneath the threshold. As each noise source that needs to be considered requires processing cycles and memory, reducing the number of sources under consideration can reduce the necessary processor cycles and memory usage in a computer. On the other hand, by clustering the noise sources into noise clusters prior to applying the transfer functions, fewer functions need to be applied, as one transfer function may apply to the entire cluster. As such, processing cycles may be saved by minimizing the number of processing steps required to reach a decision.

Figure 51:
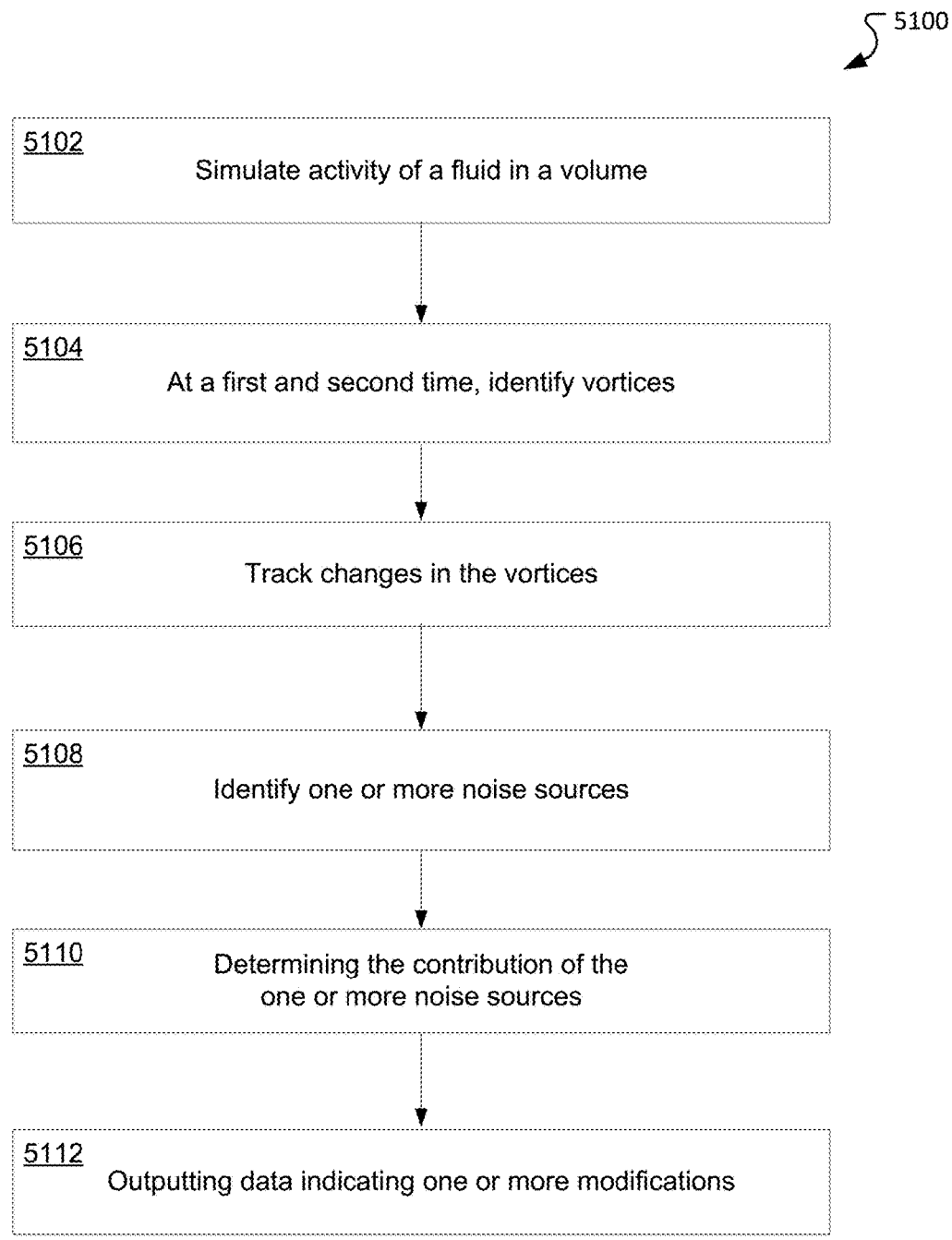
FIG. 51 is a flowchart of an example process for identifying noise sources.

FIG. 51 is a flowchart of an example process 5100 for identifying noise sources.

The process 5100 simulates 5102 activity of a fluid in a volume. The volume that represents a physical space. The activity of the fluid in the volume being simulated so as to model movement of elements within the volume;

The process 5100 identifies 5104 vortices, at a first time and a second time. At a first time in the fluid flow simulation, the process may identify a first set of vortices in a transient and turbulent flow modeled by the fluid flow. At a second time in the fluid flow simulation that is subsequent to the first time, identifying a second set of vortices in the transient and turbulent flow.

The process 5100 tracks 5106 changes in the vortices. The process 5100 may compare the first set of discrete vortices and the second set of discrete vortices.

The process 5100 identifies 5108 one or more potential noise sources based on the tracking. Noise sources can correspond to individual discrete vortices or may correspond to a clustered set of noise vortices.

The process 5100 determines 5110 the contribution of the one or more noise sources to a receiver. The contributions may be determined by applying a transfer function to each noise source.

The process 5100 outputs 5112 outputting data indicating one or more modifications to one or more geometric features of a device or an entity, based on the contribution of the one or more noise sources at the receiver.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs (also referred to as a data processing program) (i.e., one or more modules of computer program instructions, encoded on computer storage medium for execution by, or to control the operation of, data processing apparatus). A computer storage medium can be, or be included in, a computer-readable storage device, a computer-readable storage substrate, a random or serial access memory array or device, or a combination of one or more of them. The computer storage medium can also be, or be included in, one or more separate physical components or media (e.g., multiple CDs, disks, or other storage devices). The subject matter may be implemented on computer program instructions stored on a non-transitory computer storage medium.

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example: a programmable processor, a computer, a system on a chip, or multiple ones, or combinations, of the foregoing. The apparatus can include special purpose logic circuitry (e.g., an FPGA (field programmable gate array) or an ASIC (application specific integrated circuit)). The apparatus can also include, in addition to hardware, code that creates an execution environment for the computer program in question (e.g., code that constitutes processor firmware, a protocol stack, a database management system, an operating system, a cross-platform runtime environment, a virtual machine, or a combination of one or more of them). The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry (e.g., an FPGA (field programmable gate array) or an ASIC (application specific integrated circuit)).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data (e.g., magnetic, magneto optical disks, or optical disks), however, a computer need not have such devices. Moreover, a computer can be embedded in another device (e.g., a mobile telephone, a personal digital assistant (PDA), a mobile audio or video player, a game console, a Global Positioning System (GPS) receiver, or a portable storage device (e.g., a universal serial bus (USB) flash drive)). Devices suitable for storing computer program instructions and data include all forms of non-volatile memory, media and memory devices, including by way of example, semiconductor memory devices (e.g., EPROM, EEPROM, and flash memory devices), magnetic disks (e.g., internal hard disks or removable disks), magneto optical disks, and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback) and input from the user can be received in any form, including acoustic, speech, or tactile input. In addition, a computer can interact with a user by sending documents to and receiving documents from a device that is used by the user (for example, by sending web pages to a web browser on a user's user device in response to requests received from the web browser).

Embodiments of the subject matter described in this specification can be implemented in a computing system that includes a back end component (e.g., as a data server), or that includes a middleware component (e.g., an application server), or that includes a front end component (e.g., a user computer having a graphical user interface or a Web browser through which a user can interact with an implementation of the subject matter described in this specification), or any combination of one or more such back end, middleware, or front end components. The components of the system can be interconnected by any form or medium of digital data communication (e.g., a communication network). Examples of communication networks include a local area network ("LAN") and a wide area network ("WAN"), an inter-network (e.g., the Internet), and peer-to-peer networks (e.g., ad hoc peer-to-peer networks).

The computing system can include users and servers. A user and server are generally remote from each other and typically interact through a communication network. The relationship of user and server arises by virtue of computer programs running on the respective computers and having a user-server relationship to each other. In some embodiments, a server transmits data (e.g., an HTML page) to a user device (e.g., for purposes of displaying data to and receiving user input from a user interacting with the user device). Data generated at the user device (e.g., a result of the user interaction) can be received from the user device at the server.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A system for flow-induced noise source identification, comprising:
   a data processing system for noise source identification that processes data representing a fluid low in volume representing a physical space, the data processing system comprising:
   one or more processing devices and one or more hardware storage devices storing instructions that are operable, when executed by the one or more processing devices, to cause the one or more processing devices to perform operations comprising:
     simulating activity of a fluid in a volume that represents a physical space, the activity of the fluid in the volume being simulated so as to model movement of elements within the volume;

identifying a first set of vortices in a transient and turbulent flow modeled by the fluid flow that occurs at a first time in the fluid flow simulation;

identifying a second set of vortices in the transient and turbulent flow that occurs at a second subsequent time in the fluid flow simulation;

tracking changes in the vortices by comparing the first set of discrete vortices and the second set of discrete vortices;

identifying a plurality of noise sources based on the tracking;

determining the contribution of the plurality of noise sources, which occurs at a receiver location, at effecting noise at the receiver location that is at a predetermined location within the volume; and outputting data that is rendered on a display device indicating distribution of the noise sources throughout the volume and to the receiver location.

2. The system of claim 1, wherein determining the contribution comprises:

applying a transfer function to each of the plurality of noise sources, with the transfer function determining the contribution based on a relationship between a location of the respective noise source and the predetermined location of the receiver.

3. The system of claim 2, wherein the transfer function applied to each of the plurality of noise sources is a frequency dependent transfer function.

4. The system of claim 1, further comprising:

combining at least some of the plurality of noise sources into one or more clusters of noise sources that are clustered based, at least in part, on the contribution of each of the noise sources.

5. The system of claim 4, further comprising:

comparing a strength of each of the one or more noise source contributions to a threshold value for inclusion in the cluster.

6. The system of claim 4, wherein combining the plurality of the one or more noise sources into the one or more clusters improves the processing performance of the system.

7. The system of claim 6, further comprising building a physical object based using the physical modifications.

8. The system of claim 1, wherein the receiver is located at a position corresponding to an audio recording device or a human ear.

9. The system of claim 1, further comprising applying a transfer function to the one or more sound generating flow regions subsequent to the combining.

10. The system of claim 9, further comprising comparing a strength of each of the one or more noise source to a threshold value and excluding at least one noise source that has a strength beneath the threshold.

11. The system of claim 1, wherein the plurality of noise sources is a first set of noise sources, the system further comprising:

determining a second set of one or more noise sources based on a second simulation that corresponds to different physical conditions in or around the physical space.

12. The system of claim 1, further comprising causing a physical modification to one or more physical objects based on the identified area for design change.

13. The system of claim 12, further comprising optimizing a design change to minimize the contribution of one or more noise sources.

14. A computer-implemented method of simulating activity of a fluid in a volume that represents a physical space, the activity of the fluid in the volume being simulated so as to model movement of elements within the volume, the method comprising:

identifying a first set of vortices in a transient and turbulent flow modeled by the fluid flow that occurs at a first time in the fluid flow simulation;

identifying a second set of vortices in the transient and turbulent flow that occurs at a second subsequent time in the fluid flow simulation;

tracking changes in the vortices by comparing the first set of discrete vortices and the second set of discrete vortices;

identifying one or more noise sources based on the tracking;

determining the contribution that occurs at a receiver location of the one or more noise sources at effecting noise at the receiver location that is at a predetermined location within the volume; and outputting data that is rendered on a display device indicating distribution of the noise sources throughout the volume and to the receiver location.

15. The computer-implemented method of claim 14, wherein determining the contribution comprises:

applying a transfer function to at least one noise source, with the transfer function determining the contribution based on a relationship between a location of the noise source and a location of the receiver.

16. The computer-implemented method of claim 15, wherein the transfer function applied to each of the plurality of noise sources is a frequency dependent transfer function.

17. The computer-implemented method of claim 14, further comprising:

combining at least some of the one or more noise sources into one or more clusters of noise sources that are clustered based, at least in part, on the contribution of the one or more noise sources.

18. The computer-implemented method of claim 17, further comprising:

comparing a strength of each of the one or more noise source contributions to a threshold value for inclusion in the cluster.

19. The computer-implemented method of claim 18, further comprising comparing a strength of each of the one or more noise source to a threshold value and excluding at least one noise source that has a strength beneath the threshold.

20. The computer-implemented method of claim 18, wherein combining the plurality of the one or more noise sources into the one or more clusters improves the processing performance of the computer-implemented method.

21. The computer-implemented method of claim 14, wherein the receiver is located at a position corresponding to an audio recording device or a human ear.

22. The computer-implemented method of claim 14, further comprising applying a transfer function to the one or more sound generating flow regions subsequent to the combining.

23. The computer-implemented method of claim 14, wherein the plurality of noise sources is a first set of noise sources, the method further comprising:

determining a second set of one or more noise sources based on a second simulation that corresponds to different physical conditions in or around the physical space.

24. The computer-implemented method of claim 14, further comprising causing a physical modification to one or more physical objects based on the identified area for design change.

25. The computer-implemented method of claim 24, further comprising building a physical object based using the physical modifications.

26. The computer-implemented method of claim 25, further comprising optimizing a design change to minimize the contribution of one or more noise sources.

27. A computer program product stored on a computer readable non-transitory storage medium the computer program product for flow-induced noise source identification, the computer program product comprising instructions to cause a system to:
simulate activity of a fluid in a volume that represents a physical space, the activity of the fluid in the volume being simulated so as to model movement of elements within the volume;
identify a first set of vortices in a transient and turbulent flow modeled by the fluid flow that occurs at a first time in the fluid flow simulation;
identify a second set of vortices in the transient and turbulent flow that occurs at a second subsequent time in the fluid flow simulation;
track changes in the vortices by comparing the first set of discrete vortices and the second set of discrete vortices;
identify a plurality of noise sources based on the tracking;
determine the contribution of the plurality of noise sources, which occurs at a receiver location, at effecting noise at the receiver location that is at a predetermined location within the volume; and
output data that is rendered on a display device indicating distribution of the noise sources throughout the volume and to the receiver location.

28. The computer program product of claim 27, wherein the instructions to determine the contribution comprises instructions to:
apply a transfer function to each of the plurality of noise sources, with the transfer function determining the contribution based on a relationship between a location of the respective noise source and the predetermined location of the receiver.

29. The computer program product of claim 27, wherein the instructions to apply the transfer function applies the transfer function to each of the plurality of noise sources that is a frequency dependent transfer function.

30. The computer program product of claim 27, further comprises instructions to:
combine at least some of the plurality of noise sources into one or more clusters of noise sources that are clustered based, at least in part, on the contribution of each of the noise sources.

31. The computer program product of claim 30, further comprises instructions to:
compare a strength of each of the one or more noise source contributions to a threshold value for inclusion in the cluster.

32. The computer program product of claim 31, further comprises instructions to:
compare a strength of each of the one or more noise source to a threshold value and excluding at least one noise source that has a strength beneath the threshold.

33. The computer program product of claim 30, further comprises instructions to:
apply a transfer function to the one or more sound generating flow regions subsequent to the combining.

34. The computer program product of claim 27, wherein the plurality of noise sources is a first set of noise sources, the computer program product, further comprises instructions to:
determine a second set of one or more noise sources based on a second simulation that corresponds to different physical conditions in or around the physical space.

35. A system comprises:
a data processing system comprising:
one or more processor devices; and
one or more hardware storage devices storing executable computer instructions that when executed by the one or more processing devices to cause the one or more processing devices to:
simulate activity of a fluid in a volume that represents a physical space, the activity of the fluid in the volume being simulated so as to model movement of elements within the volume;
identify in the volume one or more potential sound generating vortex structures undergoing stretching at a non-uniform rate;
track changes in the vortex structures;
identifying, by the computer system, one or more noise sources based on the tracking;
determine at a receiver location the contribution of the identified one or more noise sources at effecting noise at the receiver location that is at a predetermined location within the volume; and
output data that is rendered on a display device indicating a distribution of the noise sources throughout the volume.

36. The system of claim 35, wherein the system determines the contribution by instructions to:
apply a transfer function to each of the plurality of noise sources, with the transfer function determining the contribution based on a relationship between a location of the respective noise source and the predetermined location of the receiver.

37. The system of claim 36, wherein the transfer function applied to each of the plurality of noise sources is a frequency dependent transfer function.

38. The system of claim 35, further comprising:
combine at least some of the plurality of noise sources into one or more clusters of noise sources that are clustered based, at least in part, on the contribution of each of the noise sources.

39. The system of claim 38, further comprising instructions to:
compare a strength of each of the one or more noise source contributions to a threshold value for inclusion in the cluster.

* * * * *